United States Patent
Matsuno

(10) Patent No.: US 7,437,393 B2
(45) Date of Patent: Oct. 14, 2008

(54) SIGNAL PROCESSING APPARATUS, NON-INTEGER DIVIDER, AND FRACTIONAL N-PLL SYNTHESIZER USING THE SAME

(75) Inventor: Noriaki Matsuno, Tokyo (JP)

(73) Assignee: NEC CORPORATION, Tokyo (JP)

( * ) Notice: Subject to any disclaimer, the term of this patent is extended or adjusted under 35 U.S.C. 154(b) by 818 days.

(21) Appl. No.: 11/038,433

(22) Filed: Jan. 21, 2005

(65) Prior Publication Data
US 2005/0182804 A1    Aug. 18, 2005

Related U.S. Application Data

(63) Continuation of application No. PCT/JP2003/008073, filed on Jun. 26, 2003.

(30) Foreign Application Priority Data
Jul. 23, 2002    (JP) .............................. 2002-213888

(51) Int. Cl.
G06F 17/10    (2006.01)
(52) U.S. Cl. ....................................... 708/300
(58) Field of Classification Search ................... 708/300
See application file for complete search history.

(56) References Cited

U.S. PATENT DOCUMENTS

| | | | |
|---|---|---|---|
| 5,038,117 A * | 8/1991 | Miller | 331/16 |
| 5,226,001 A * | 7/1993 | Garverick | 708/313 |
| 6,075,474 A * | 6/2000 | Gabet et al. | 341/143 |
| 6,262,604 B1 * | 7/2001 | Gabet et al. | 327/107 |

FOREIGN PATENT DOCUMENTS

| JP | H05-502154 A | 4/1993 |
|---|---|---|
| JP | H11-145828 A | 5/1999 |

(Continued)

*Primary Examiner*—David H Malzahn
(74) *Attorney, Agent, or Firm*—Sughrue Mion, PLLC

(57) ABSTRACT

Signal processing apparatus or non-integer divider with a small circuit scale and a fractional N-PLL synthesizer comprising same. An adder 2 and a delay device 4 constitute a 20-bit input accumulator and its input is connected to a signal input terminal 1. Adder 8 and a delay device 10 constitute a 9-bit input accumulator. Into higher 8 bits of its input, higher 8 bits of the output of the accumulator comprising the adder 2 and the delay device 4 are inputted. The output of a 3-input NAND gate 30 is connected to the remaining lowest bit input. An adder 13 and a delay device 15 constitute a 6-bit input accumulator. Higher 6 bits of an output signal of the adder 8 are inputted into this 6-bit input accumulator. An adder 18 and a delay device 20 constitute a 4-bit input accumulator. Higher 4 bits of an output signal of the adder 13 are inputted into this 4-bit input accumulator. Lower 3 bits of output data of the 4-bit delay device 20 are inputted into the 3-input NAND gate 30. Overflow signals 22, 23, 24, and 25 of the respective accumulator are inputted into a signal processing part 27, which sums the overflow signal 22, the result of first order differentiation of the overflow signal 23, the result of second order differentiation of the overflow signal 24, and the result of third order differentiation of the overflow signal 25, and then outputs the summing result from a terminal 28.

33 Claims, 20 Drawing Sheets

FOREIGN PATENT DOCUMENTS

| | | |
|---|---|---|
| JP | 2001-127632 A | 5/2001 |
| JP | 2001-237709 A | 8/2001 |
| JP | 2002-57578 A | 2/2002 |
| JP | 2003-23351 A | 1/2003 |
| JP | 2003-46389 A | 2/2003 |

\* cited by examiner

US 7,437,393 B2

SIGNAL PROCESSING APPARATUS, NON-INTEGER DIVIDER, AND FRACTIONAL N-PLL SYNTHESIZER USING THE SAME

CROSS-REFERENCE TO RELATED APPLICATIONS

This application is a continuation of International Application No. PCT/JP2003/008073, filed on 26. Jun. 2003, and claims priority to Japanese Patent Application No. 2002-213888, filed on 23. Jul. 2002, both of which are incorporated herein by reference in their entireties.

FIELD OF THE INVENTION

This invention relates to a signal processing apparatus, non-integer divider, and fractional N-PLL synthesizer using the same. Definition: The "frequency divider" is termed "divider" in this application, and "divide" refers to "frequency-divide."

DEFINITION

The term "high bits" herein refers to certain number of bit or bits appearing from the most significant bit.
The term "lower bits" herein refers to the less significant bit or bits.

BACKGROUND OF THE INVENTION

As an example of signal processing apparatus, sigma-delta modulator is known. The configuration of a conventional and typical fourth order sigma-delta modulator is shown in FIG. 4.

In FIG. 4, a digital signal is inputted into an input terminal 57. For the sake of convenience, we assume that the input digital signal is a 20-bit signal. In this case, the input terminal 57 consists of 20 terminals. 58, 63, 68, and 73 are 20-bit input and 20-bit output adders. 60, 65, 70, and 75 are 20-bit input and 20-bit output delay elements, and they output their input values delayed by one clock.

The adder 58 and the delay element 60 constitute a 20-bit input and 20-bit output accumulator. That is to say, the adder 58 adds the input digital signal 57 to the output signal of the delay element 60, which is the output signal of the adder 58 delayed by one clock. The addition result is outputted to a line 59. If there is an overflow as a result of the addition, a 1-bit overflow signal 62 will be outputted to an overflow line.

A block consisting of the adder 63 and the delay element 65 also constitutes an accumulator, and its input is the output signal of the adder 58, i.e. the output signal of the accumulator consisting of the adder 58 and the delay element 60. Likewise, a pair of the adder 68 and the delay element 70, and a pair of the adder 73 and the delay element 75 also constitute a respective accumulator, therefore the configuration is such that four accumulators are connected in cascade.

67, 72, and 77 are overflow signals of the adders 63, 68, and 73, respectively.

A concrete configuration example of the constituent element 79 is shown in FIG. 5. 35, 37, 39, 41, 43, and 45 are delay elements, which output their input values delayed by one clock. 36, 38, 40, 42, 44, and 46 are subtractors, which subtract the input values affected by the respective delay element from the input values unaffected by the respective delay element, and output the result of the subtraction. The inputs of 48, an adder with four inputs, are the overflow signal 62, the outputs of the subtractors 36, 40, and 46.

With this configuration, the constituent element 79 has the functions of receiving the overflow signals 62, 67, 72, and 77 outputted by the accumulators 58, 63, 68, and 73, summing the overflow signal 62, the result of first order differentiation of the overflow signal 67, the result of second order differentiation of the overflow signal 72, and the result of third order differentiation of the overflow signal 77, and then outputting the summing result from the terminal 80.

A whole block consisting of the said four accumulators and the constituent element 79 constitutes a fourth order sigma-delta modulator. Its input terminal is 57, and output terminal is 80. Likewise, an nth order sigma-delta modulator consists of n accumulators, and an element that receives and processes the overflow signals of each accumulator.

In this conventional technology, for example, since an nth order sigma-delta modulator corresponding to an input signal with 20-bit dynamic range requires n 20-bit accumulators and n 20-bit delay elements, the circuit scale will be big. This not only entails some disadvantages such as increases in chip area and consumption current, but also increases the noise leaking to the power supply line and the ground line while operating.

Such sigma-delta modulator is used widely as a constituent element of fractional frequency divider. The related technology is disclosed in U.S. Pat. Nos. 4,609,881, 4,758,802 and 4,965,531.

The general configuration of a fractional N-PLL synthesizer is shown in FIG. 6. In FIG. 6, the output of a VCO 84 is split into two signals. One becomes a final output 88 of the PLL synthesizer, and the other is inputted into an integer divider 86. The output divided by the integer divider 86 is inputted into the phase comparator (PD hereafter) 81. As the other input, a reference signal 87 is inputted into PD 81, and the phase difference between the reference signal 87 and the output signal of the integer divider 86 is outputted to a charge pump(CP hereafter) 82. The CP 82 converts the phase difference information it receives into current or voltage, which is fed back to the VCO 84 after passing through a loop filter (L.F. hereafter) 83. By the function of this feedback, the frequency of the signal that VCO 84 outputs is locked to a frequency of the reference signal 87 multiplied by a frequency division ratio (termed "division ratio" hereinafter).

In the configuration of FIG. 6, by having the division ratio control device 85 change the frequency division ratio of the integer divider 86 over time, non-integer division ratio is realized as a time average value. Sigma-delta modulator is used as such a division ratio control device. When a sigma-delta modulator is used as a constituent element of a fractional N-PLL synthesizer, its big circuit scale results in disadvantages such as increases in chip area and consumption current, and an inferior C/N ratio due to the noise leaking to the power supply line and the ground line while operating.

As described above, since an nth order sigma-delta modulator requires n adders and n delay elements, it has the shortcoming that the circuit scale is big. With a fractional N-PLL synthesizer utilizing a sigma-delta modulator, the big circuit scale of the sigma-delta modulator results in disadvantages such as increases in chip area and consumption current, and an inferior C/N ratio due to the noise leaking to the power supply line and the ground line during the operation of the sigma-delta modulator.

The present invention aims at solving the problems described above, and it is an object thereof to provide a signal processing apparatus with a small circuit scale.

Another object of the present invention is to provide a non-integer divider equipped with the signal processing apparatus described above.

A further object of the present invention is to provide a fractional N-PLL synthesizer equipped with the non-integer divider described above.

SUMMARY OF THE DISCLOSURE

A signal processing apparatus according to a first aspect of the present invention comprises cascade-connected n-staged accumulators, processing means for performing (m−1)th order differentiation of an overflow signal of an mth-stage accumulator (where 2≦m≦n), and adding means for adding an output of the first-stage accumulator and all results of said differentiation of the second to nth-stage accumulators and outputting an added result. A signal input of p(1) bits is inputted into the first-stage accumulator of p(1) bits. Higher q(m−1) bits (where 1≦q(m−1)≦p(m)) of an output of an (m−1)th-stage accumulator are inputted into higher bits of an mth-stage accumulator of p(m) bits (where p(m)≦p(m−1)). Furthermore, a logical operation result of at least a prescribed accumulator of the (m+1)th-stage or later stage or stages, or an external {p(m)−q(m−1)} bit signal, which is a random signal through the input terminal, is inputted into the remaining lower bits of said mth-stage accumulator 23m. In this configuration, p(1)>p(n) holds.

A signal processing apparatus according to a second aspect of the present invention comprises: a first p-bit signal input terminal and a second k-bit input signal terminal, a first p-bit accumulator and a second q-bit accumulator, where q is an integer not larger than (p−1), and adding means for adding an overflow signal of the first accumulator and a signal obtained by first order differentiation of an overflow signal of the second accumulator. A p-bit signal inputted from the first signal input terminal is inputted into the first accumulator, and higher (q−k) bits of the output signal of the first accumulator are inputted into higher (q−k) bits of the input of the second accumulator. The second signal input terminal is connected to the remaining k bits of the second accumulator.

A signal processing apparatus according to a third aspect of the present invention comprises a p(1)-bit first signal input terminal and a k-bit second signal input terminal with n accumulators (the first through nth), where n is an integer of at least 3, processing means for performing (m−1)th order differentiation of an overflow signal of an mth accumulator for all the integers m (all the integers form 1 to n inclusive, and adding means for adding up the results of the differentiation of overflow signals of the first through nth accumulators. Provided that the number of bits of the mth accumulator is p(m), where p(2) is an integer not larger than (p(1)−1), higher (p(2)−k) bits of an output signal of the first accumulator are inputted into higher (p(2)−k) bits of the input of the second accumulator. The second signal input terminal is connected to the remaining k bits of the second accumulator. Provided that p(s) is an integer not larger than p(s−1) where the integers "s" are all the integers of 3 through n inclusive, higher p(s) bits of an output signal of an (s−1)th accumulator are inputted into an sth accumulator.

A signal processing apparatus according to a fourth aspect of the present invention is characterized by k=1 in the signal processing apparatus according to either the second or third aspect.

A signal processing apparatus according to a fifth aspect of the present invention is the signal processing apparatus according to either the third or fourth aspect wherein arbitrary (random) k bits are selected from an output signal of at least an accumulator of the third stage or later stage or stages, and used as the signal inputted into the k-bit second signal input terminal.

A signal processing apparatus according to a sixth aspect of the present invention is the signal processing apparatus according to either the third or fourth aspect wherein the signal inputted into the k-bit second signal input terminal is obtained by performing logic synthesis on an r-bit signal arbitrarily (randomly) selected from the output of an accumulator of the third stage or later stage or stages.

A signal processing apparatus according to a seventh aspect of the present invention comprises a first p-bit signal input terminal and a second k-bit signal input terminal with a first p-bit accumulator and a second q-bit accumulator, where q is an integer not larger than (p−1), and adding means for adding a one-clock delayed overflow signal of the first accumulator and a signal obtained by first order differentiation of an overflow signal of the second accumulator. A p-bit signal inputted from the first signal input terminal is inputted into the first p-bit accumulator, and higher (q−k) bits of the one-clock delayed output signal of the first accumulator are inputted into higher (q−k) bits of the input of the second accumulator. The second signal input terminal is connected to the remaining k bits of the second accumulator.

A signal processing apparatus according to an eighth aspect of the present invention comprises a p(1)-bit first signal input terminal and a k-bit second signal input terminal with n accumulators (the first through nth), where n is an integer of at least 3, and processing means for performing (m−1)th order differentiation of an (n−m) clock delayed overflow signal of an mth accumulator for all the integers m (all the integers from 1 to n inclusive), and adding means for adding up the results of the differentiation of overflow signals of the first through nth accumulators. The number of bits of the mth accumulator is p(m), where p(2) is an integer not larger than (p(1)−1), and higher (p(2)−k) bits of a one-clock delayed output signal of the first accumulator are inputted into higher (p(2)−k) bits of the input of the second accumulator. The second signal input terminal is connected to the remaining k bits of the first accumulator. Provided that p(s) is an integer not larger than p(s−1) where the integers "s" are all the integers of 3 through n inclusive, higher p(s) bits of a one-clock delayed output signal of an (s−1)th accumulator are inputted into an sth accumulator.

A signal processing apparatus according to a ninth aspect of the present invention is characterized by k=1 in the signal processing apparatus according to either the seventh or eighth aspect.

A signal processing apparatus according to a tenth aspect of the present invention is the signal processing apparatus according to either the eighth or ninth aspect wherein arbitrary k bits are selected from an output signal of at least an accumulator of the third-stage or later stage or stages, and used as the signal inputted into the k-bit second signal input terminal.

A signal processing apparatus according to a eleventh aspect of the present invention is the signal processing apparatus according to either the eighth or ninth aspect wherein the signal inputted into the k-bit second signal input terminal is obtained by performing logic synthesis on an r-bit signal arbitrarily selected from the output of an accumulator of the third-stage or later stage or stages.

A signal processing apparatus according to a twelfth aspect of the present invention is the signal processing apparatus according to either the third, fourth, fifth or sixth aspect, and comprises a k(1)-bit third signal input terminal in addition to the p-bit first signal input terminal and the k-bit second signal input terminal. For an integer t which is not less than 3 and not larger than n, higher (p(t)−k(1)) bits of an output signal of an adder of a (t−1)th accumulator are inputted into higher (p(t)− k(1)) bits of an input of a tth accumulator. The k(1)-bit third input terminal is connected to the remaining k(1) bits of the tth accumulator.

A signal processing apparatus according to a thirteenth aspect of the present invention is the signal processing apparatus according to either the eighth, ninth, tenth or eleventh aspect, and comprises a k(1)-bit third input terminal in addition to the p-bit first signal input terminal and the k-bit second signal input terminal. For an integer t which is not less than 3 and not larger than n, higher (p(t)−k(1)) bits of a one-clock delayed output signal of an adder of a (t−1)th accumulator are inputted into higher (p(t)−k(1)) bits of an input of a tth accumulator. The k(1)-bit input terminal is connected to the remaining k(1) bits.

A signal processing apparatus according to a fourteenth aspect of the present invention is the signal processing apparatus according to either the twelfth or thirteenth aspect wherein arbitrary k(1) bits are selected from an output signal of at least an accumulator of a (t+1)th-stage or later stage or stages, and used as the signal inputted into the k(1)-bit third input terminal.

A signal processing apparatus according to a fifteenth aspect of the present invention is the signal processing apparatus according to either the eleventh or twelfth aspect wherein the signal inputted into the k(1)-bit third input terminal is obtained by performing logic synthesis on an r-bit signal arbitrarily selected from an output of at least an accumulator of a (t+1)th-stage or later stage or stages.

A signal processing apparatus according to a sixteenth aspect of the present invention is characterized by k(1)=1 in the signal processing apparatus according to either the twelfth, thirteenth, fourteenth or fifteenth aspect.

A signal processing apparatus according to a seventeenth aspect of the present invention is the signal processing apparatus according to either the third, fourth, fifth or sixth aspect and comprises a k(w)-bit input terminal for a random integer w, which is not less than 1 and not larger than v, where v integers are selected from (n−2) integer values included within a range of 3 to n, and their values are listed, t(1), t(2), ..., t(v) in ascending order. Higher p {t(w)}−k(w)} bits of an output signal of a {t(w)−1}th accumulator are inputted into higher p {t(w)}−k(w)} bits of an input of a t(w)th accumulator. The k(w)-bit input terminal is connected to the remaining k(w) bits of the t(w)th accumulator.

A signal processing apparatus according to a eighteenth aspect of the present invention is the signal processing apparatus according to either the eighth, ninth, tenth or eleventh aspect and comprises a k(w)-bit input terminal for a random integer w, which is not less than 1 and not larger than v, where v integers are selected from (n−2) integer values included within the range of 3 and n, and their values are listed, t(1), t(2), ..., t(v) in ascending order. Higher p {t(w)−k(w)} bits of a one-clock delayed output signal of a {t(w)−1}th accumulator are inputted into higher p {t(w)−k(w)} bits of an input of a t(w)th accumulator. The k(w)-bit input terminal is connected to the remaining k(w) bits of the t(w)th accumulator.

A signal processing apparatus according to a nineteenth aspect of the present invention is the signal processing apparatus according to either the seventeenth or eighteenth aspect wherein arbitrary k(w) bits are selected from an output signal of at least an accumulator of a (t(w)+1)th-stage or later stage or stages for integers w (some or all of the integers from 1 to v inclusive), and used as the signal inputted into the k(w)-bit input terminal.

A signal processing apparatus according to a twentieth aspect of the present invention is the signal processing apparatus according to either the seventeenth, eighteenth or nineteenth aspect wherein the signal inputted into the k(w)-bit input terminal is obtained by performing logic synthesis on an r(w)-bit signal arbitrarily selected from an output of at least an accumulator of (t(w)+1)th-stage or later stage or stages for integers w (some or all of the integers from 1 to v inclusive).

A signal processing apparatus according to a twenty-first aspect of the present invention is characterized by k(w)=1 for all the integers w from 1 to v inclusive in the signal processing apparatus according to either the seventeenth, eighteenth or nineteenth aspect.

A signal processing apparatus according to a twenty-second aspect of the present invention is the signal processing apparatus according to one of the aspects from twelfth to twenty-first without the k-bit second signal input terminal. Higher p(2) bits of an output signal of a first accumulator are inputted into higher p(2) bits of an input of a second accumulator.

A signal processing apparatus according to a twenty-third aspect comprises a p-bit first signal input terminal with a p-bit first accumulator and a q-bit second accumulator, where q is an integer not larger than (p−1), and adding means for adding an overflow signal of the first accumulator and a signal obtained by first order differentiation of an overflow signal of the second accumulator. A p-bit signal inputted from the first signal input terminal is inputted into the p-bit first accumulator, and higher q bits of an output signal of the first accumulator are inputted into higher q bits of the input of the second accumulator.

A signal processing apparatus according to a twenty-fourth aspect of the present invention comprises a p(1)-bit first signal input terminal with n accumulators (the first through nth), where n is an integer of at least 3, processing means for performing (m−1)th order differentiation of an overflow signal of an mth accumulator for all the integers m (all the integers from 1 to n inclusive), and adding means for adding up the results of the differentiation of overflow signals of the first through nth accumulators. Provided that the number of bits of the mth accumulator is p(m), where p(2) is an integer not larger than (p(1)−1), higher p(2) bits of an output signal of the first accumulator are inputted into higher p(2) bits of the input of the second accumulator. Provided that p(s) is an integer not larger than p(s−1) where the integers "s" are all the integers of 3 through n inclusive, higher p(s) bits of an output signal of an (s−1)th accumulator are inputted into an sth accumulator.

A signal processing apparatus according to a twenty-fifth aspect of the present invention is the signal processing apparatus according to one of the aspects from first to twenty-fourth wherein all accumulators, and all means for performing differentiation and adding that comprise the signal processing apparatus operate in synchronization with a clock signal supplied externally.

According to a twenty-sixth aspect of the present invention, a non-integer divider comprising an integer divider and one of the signal processing apparatuses according to one of first through 25th aspects is provided. The division ratio of the integer divider is controlled by an output value of the signal processing apparatus over time.

A non-integer divider according to a twenty-seventh aspect of the present invention is the non-integer divider according to the twenty-sixth aspect wherein an output signal of the integer divider is used as a clock of the signal processing apparatus.

A non-integer divider according to a twenty-eighth aspect of the present invention is the non-integer divider according to the twenty-sixth aspect comprising a clock generating device in synchronization with the operation of the integer divider as means for generating clock of the signal processing apparatus.

A non-integer divider according to a twenty-ninth aspect of the present invention is the non-integer divider according to the twenty-sixth aspect wherein a delayed output signal of the integer divider is used as means for generating clock of the signal processing apparatus.

According to a thirtieth aspect of the present invention, a fractional N-PLL synthesizer comprising the non-integer divider according to either the twenty-sixth, twenty-seventh, twenty-eighth, or twenty-ninth aspect.

A fractional N-PLL synthesizer according to a thirty-first aspect of the present invention is the fractional N-PLL synthesizer according to the thirtieth aspect wherein a reference signal of the synthesizer is used as a clock of the signal processing apparatus.

A fractional N-PLL synthesizer according to a thirty-second aspect of the present invention is the fractional N-PLL synthesizer according to the thirty-first aspect comprising a clock generating device in synchronization with a reference signal of the synthesizer as means for generating clock of the signal processing apparatus.

A fractional N-PLL synthesizer according to a thirty-third aspect of the present invention is the fractional N-PLL synthesizer according to the thirty-first aspect wherein a delayed reference signal of the synthesizer is used as a clock of the signal processing apparatus.

PREFERRED EMBODIMENTS OF THE INVENTION

Figure 34:
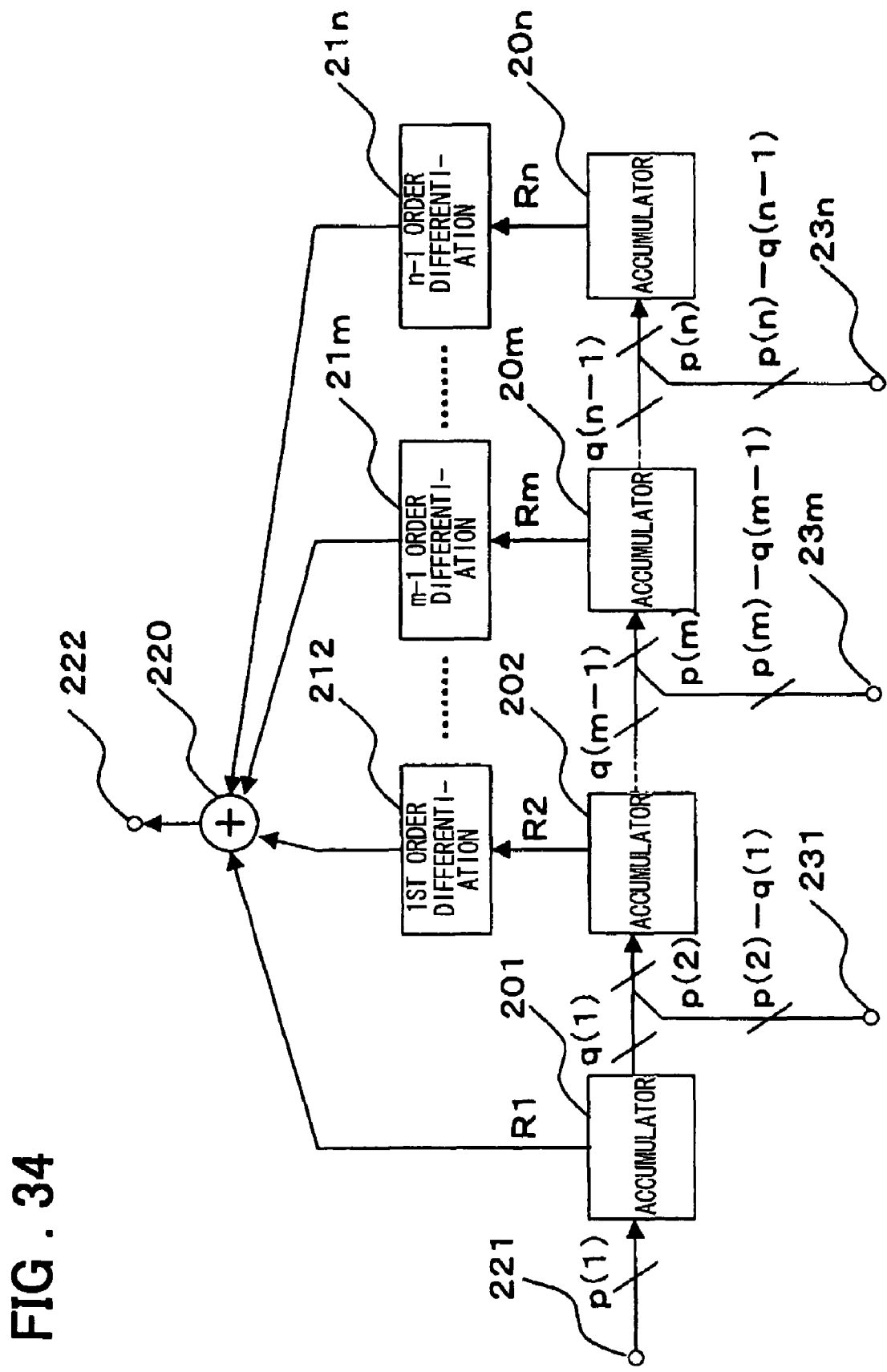
FIG. 34 is a block diagram showing an embodiment of the signal processing apparatus according to the present invention.

FIG. 34 is a block diagram showing an embodiment of the signal processing apparatus according to the present invention. In FIG. 34, the signal processing apparatus comprises cascade-connected n-staged accumulators (201, 202, ..., 20$m$, ..., 20$n$), processing means (21$m$) for performing (m−1)th order differentiation of an overflow signal Rm of an mth-stage accumulator 20$m$, (where $2 \leq m \leq n$), and an adding means (220) for adding an output R1 of the first-stage accumulator 201 and all results of said differentiation of the second to nth-stage accumulators and outputting the added result to an output 222.

In such a signal processing apparatus, a p(1)-bit signal is inputted into the first-stage accumulator 201 of p(1) bits from an input terminal 221. Higher q(m−1) bits (where $1 \leq q(m-1) \leq p(m)$) of an output of an (m−1)th-stage accumulator 20(m−1) are inputted into higher bits of an mth-stage accumulator 20$m$ of p(m) bits (where $p(m) \leq p(m-1)$). Furthermore, a logical operation result of at least a prescribed accumulator of the (m+1)th-stage or later stage or stages, or an external {p(m)−q(m−1)}-bit signal, which is a random signal through an input terminal 23$m$, is inputted into the remaining lower bits of the mth-stage accumulator 20$m$. If p(m)=q(m−1) holds, the input terminal 23$m$ will not exist. In this configuration, accumulator of each stage is configured so that p(1) >p(n) holds.

Figure 1:
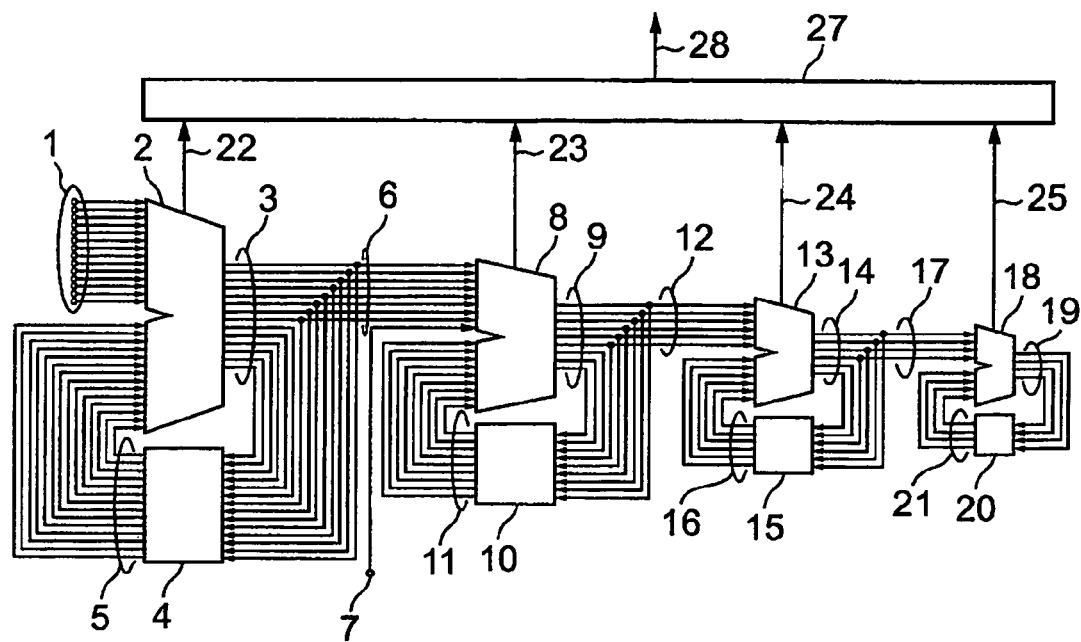
FIG. 1 is a block diagram showing a first embodiment of the signal processing apparatus according to the present invention.

FIG. 1 is a block diagram showing a first embodiment of the signal processing apparatus according to the present invention. A terminal 1 is the terminal that an external signal is inputted into. The terminal 1 has only 14 lines in FIG. 1, but in reality there are 20 signal lines (for 20 bits). A 20-bit input adder 2 and a 20-bit delay device 4 constitute a 20-bit input accumulator. An input signal of this 20-bit accumulator is a 20-bit signal inputted from the terminal 1.

A 9-bit input adder 8 and a 9-bit delay device 10 constitute a 9-bit input accumulator. Into higher 8 bits of the 9 bits input of this accumulator, higher 8 bits of an output of the adder 2, i.e. higher 8 bits of an output of the 20-bit accumulator comprising the adder 2 and the delay device 4, are inputted. A terminal 7 is connected to the remaining lowest bit.

A 6-bit input adder 13 and a 6-bit delay device 15 constitute a 6-bit input accumulator. Higher 6 bits of an output signal of the adder 8 are inputted into this 6-bit input accumulator.

A 4-bit input adder 18 and a 4-bit delay device 20 constitute a 4-bit input accumulator. Higher 4 bits of an output signal of the adder 13 are inputted into this 4-bit input accumulator.

Figure 2:
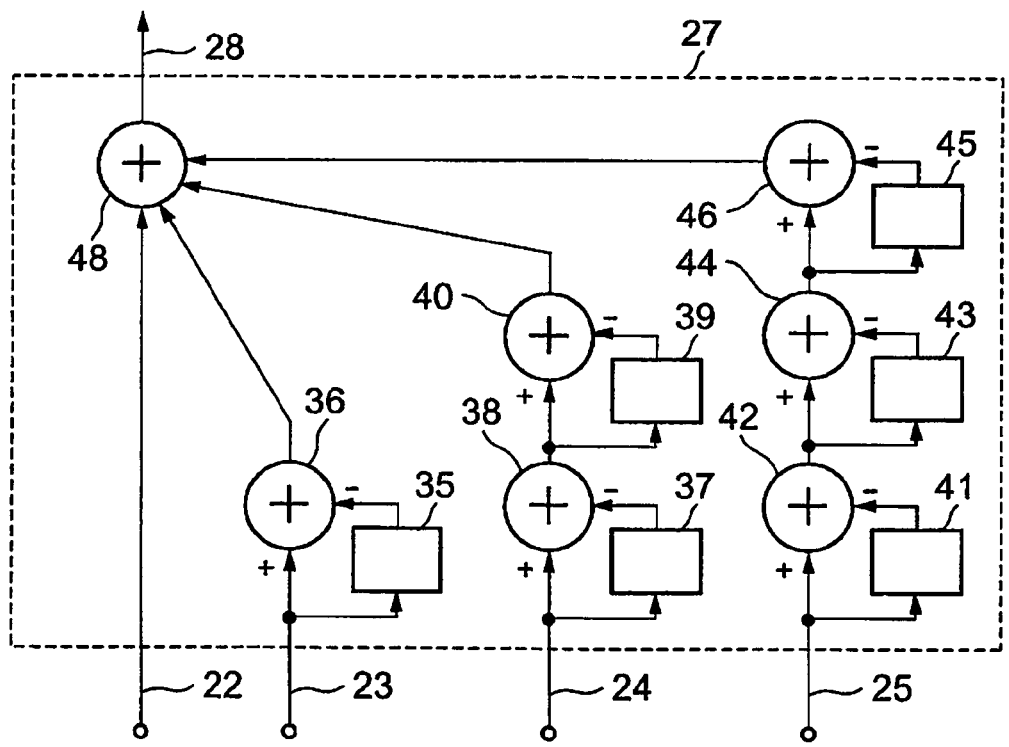
FIG. 2 is a circuit diagram showing an example of the signal processing part shown in FIG. 1.
Figure 5:
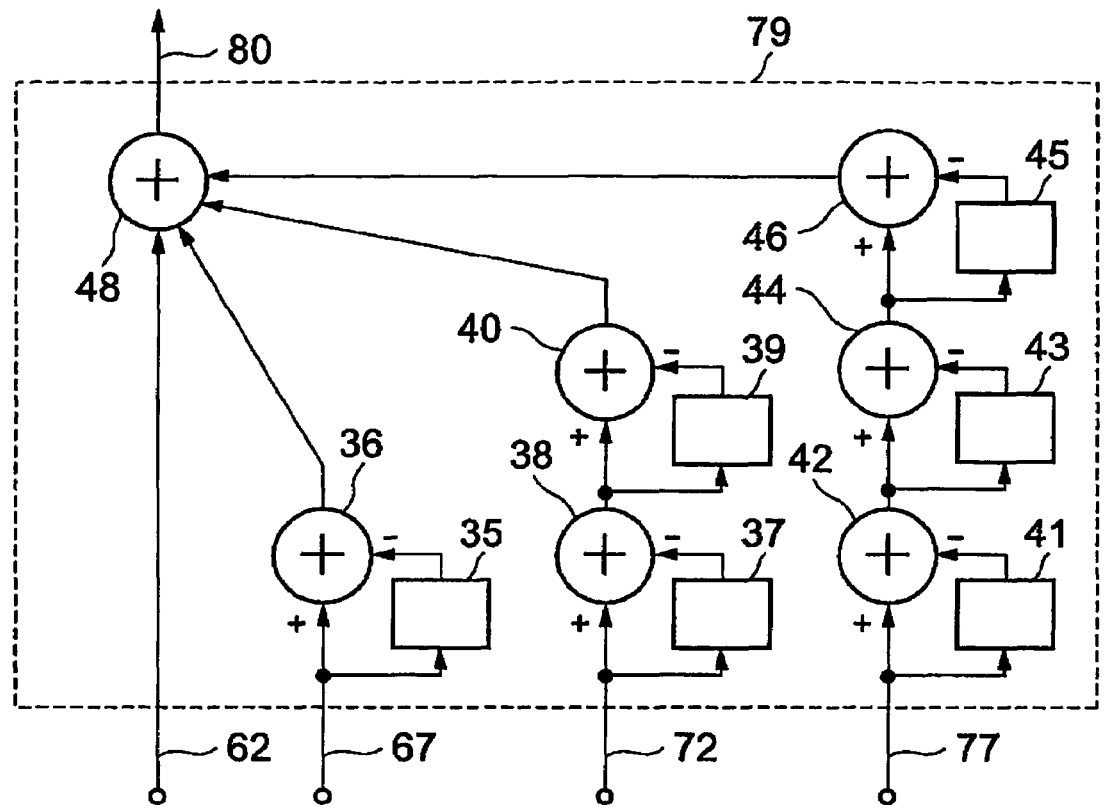
FIG. 5 is a circuit diagram showing an example of the signal processing part shown in FIG. 4.

Overflow signals 22, 23, 24, and 25 of the respective accumulator are inputted into a signal processing part (unit) 27. A concrete configuration example of the signal processing part 27 is shown in FIG. 2. The basic configuration of the signal processing part 27 is the same as the one in the conventional technology described in FIG. 5. In other words, 35, 37, 39, 41, 43, and 45 are delay devices and they output their input values delayed by one clock. 36, 38, 40, 42, 44, and 46 are subtractors, which subtract the input values affected by the respective delay device from the input values unaffected by the respective delay device, and output the result of the subtraction. 48 is an adder with 4 inputs.

With this configuration, the signal processing part 27 has the functions of summing carry signals, i.e. the overflow signal 22, the result of first order differentiation as the overflow signal 23, the result of second order differentiation as the overflow signal 24, and the result of third order differentiation as the overflow signal 25, and then outputting the summing result from a terminal 28.

A whole block consisting of the four accumulators and the signal processing part 27 constitutes a signal processing apparatus. Its input terminal is 1, and output terminal is 28. Also, as discussed later, the input terminal 7 is a terminal for connecting an external signal source that generates 0s and 1s randomly.

Figure 4:
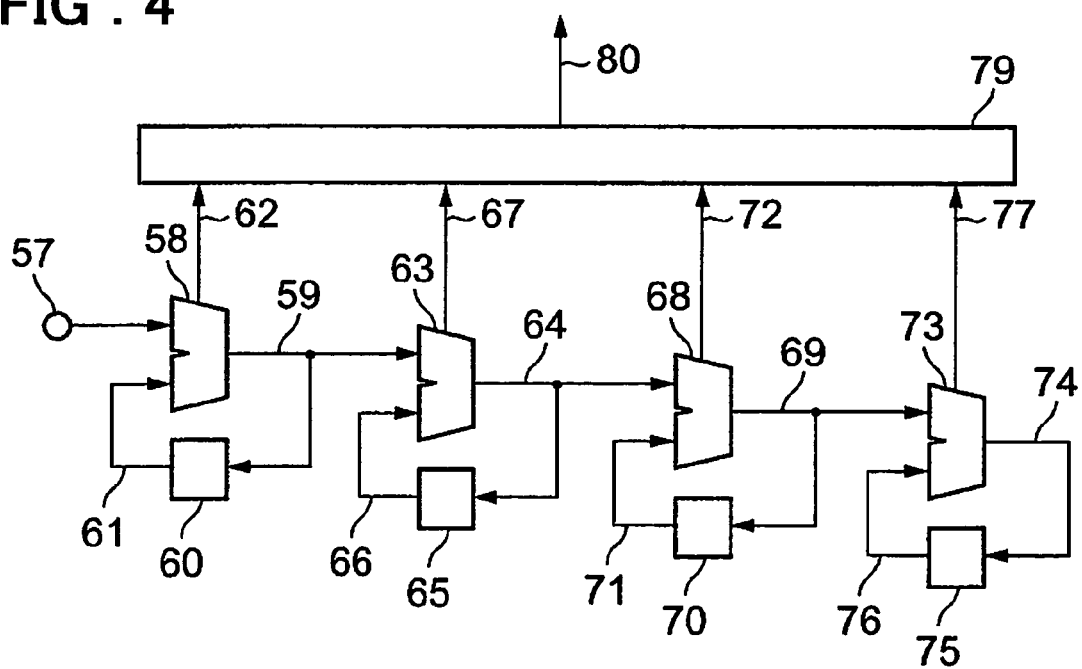
FIG. 4 is a block diagram showing an example of a conventional signal processing apparatus.

In the configuration shown in FIG. 1, the accumulator 2 and delay device 4 are 20 bits, the accumulator 8 and delay device 10 are 9 bits, the accumulator 13 and delay device 15 are 6 bits, and the accumulator 18 and delay device 20 are 4 bits. The circuit scale is almost proportional to the sum of these bit numbers. In other words, the circuit scale corresponds to 20+9+6+4=39 bits. On the other hand, in the configuration of the conventional technology shown in FIG. 4, the circuit scale corresponds to 20×4=80 bits. This means that the circuit scale of the configuration shown in FIG. 1 is half of the one of the configuration shown in FIG. 4 while maintaining the same input bit number.

Figure 3:
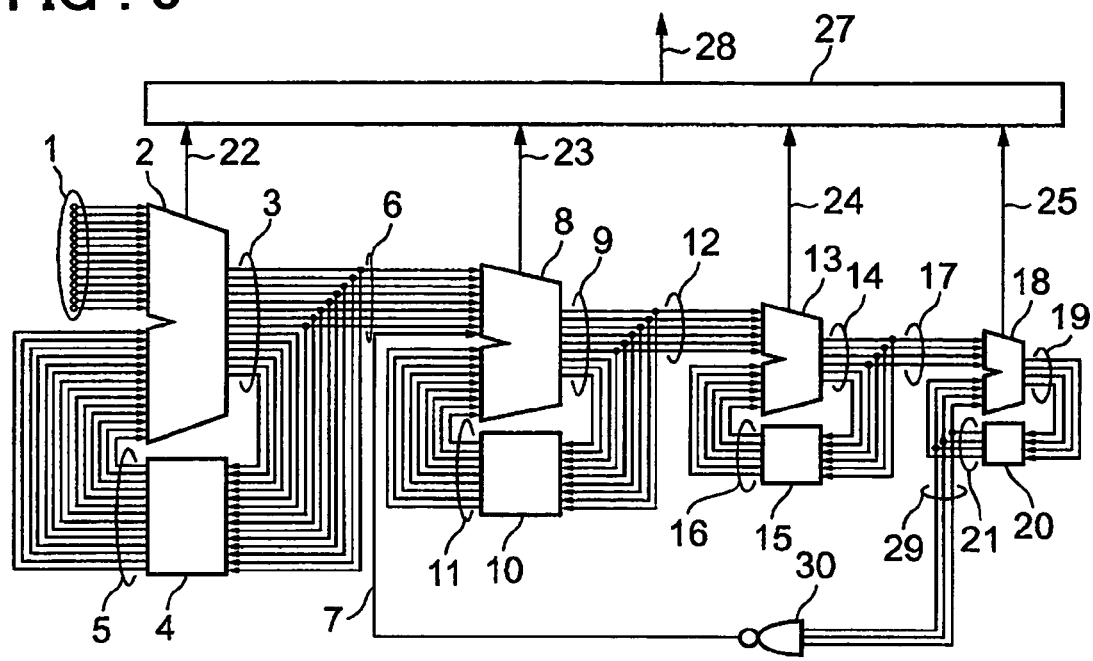
FIG. 3 is a block diagram showing a second embodiment of the signal processing apparatus according to the present invention.

FIG. 3 is a block diagram showing a second embodiment of the signal processing apparatus according to the present invention. It is nearly identical to the one shown in FIG. 1 configurationally. The difference is the fact that an output signal of a 3-input NAND gate 30 is inputted into the input terminal 7, which is the lowest bit input of an input of the 9-bit input accumulator 8. Lower 3 bits of output data of the 4-bit delay device 20 are inputted into the 3-input NAND gate 30. This means that the output of the 3 input NAND gate 30, whose input is lower 3 bits of the output signal of the delay device 20 (a one-clock delayed output signal of the accumulator 18), is used as a substitute for the external signal source in FIG. 1 that is inputted into the input terminal 7 and generates 0s and 1s randomly. This takes advantage of the following fact. Namely, in a configuration wherein multiple accumulators are cascade-connected such as the configuration shown in FIG. 1, the later stage accumulator is in, the more the variable randomness of its output value increases. Also, the reason why the 3-input NAND gate 30 is used is that it can obtain a signal with even higher randomness from a signal, with increased randomness, of an accumulator of a later stage.

Figure 7:
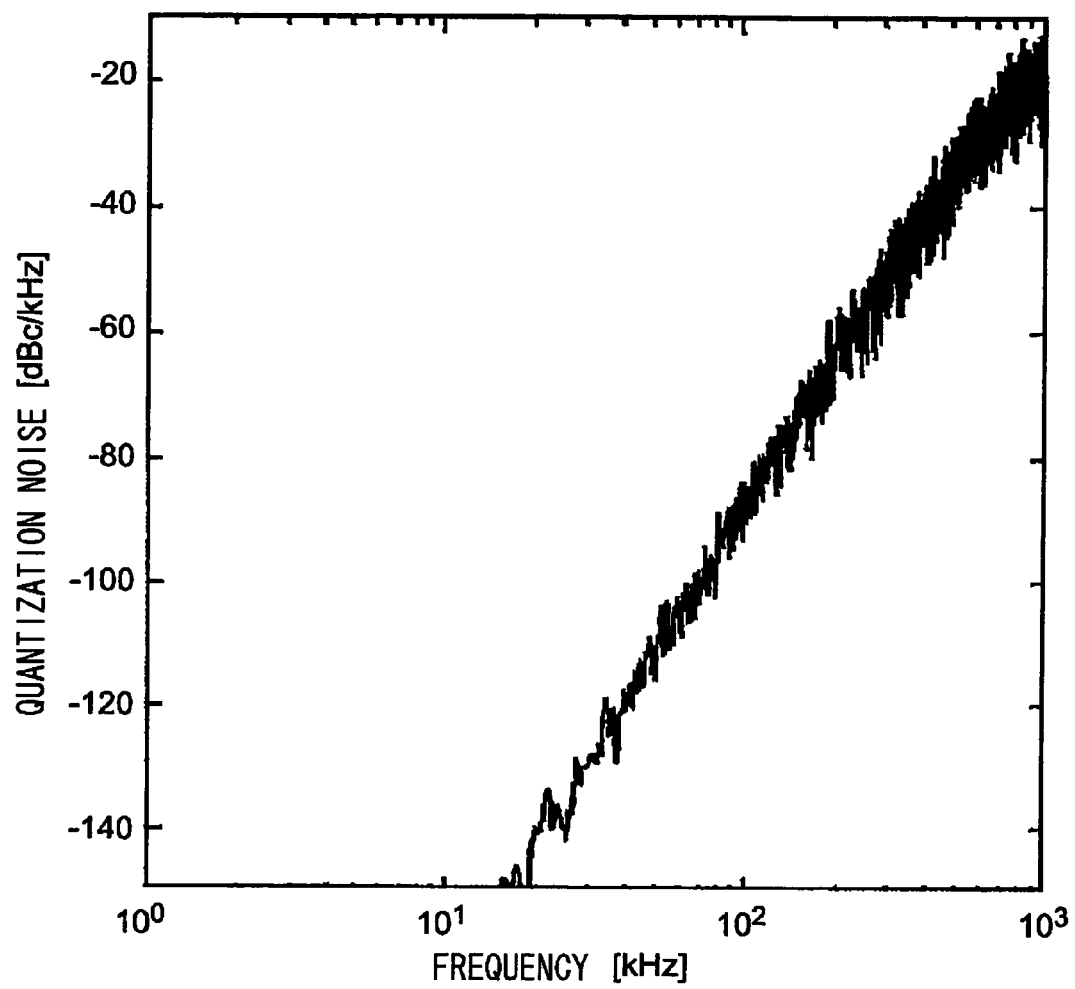
FIG. 7 is a diagram useful in describing the frequency-quantization noise characteristic of a conventional signal processing apparatus.
Figure 8:
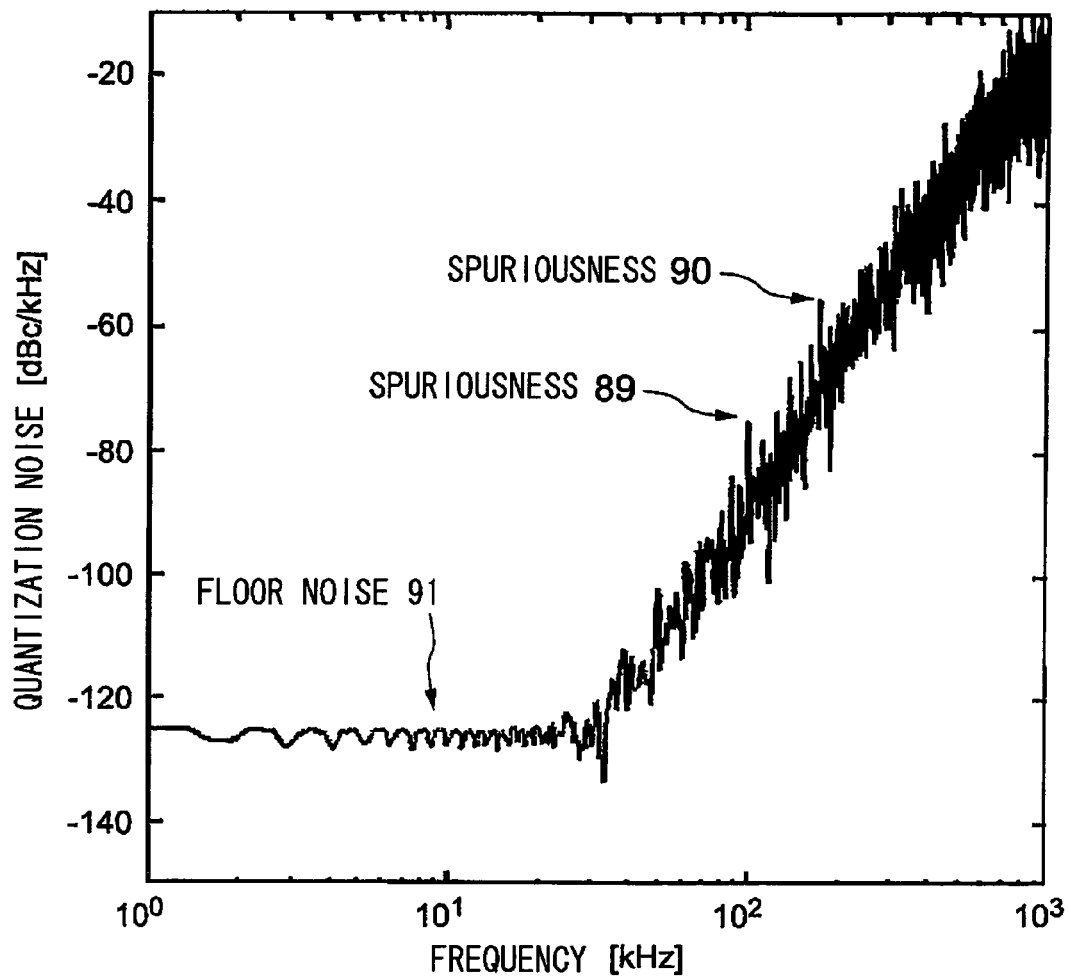
FIG. 8 is a diagram useful in describing the frequency-quantization noise characteristic of the signal processing apparatus according to the present invention.
Figure 9:
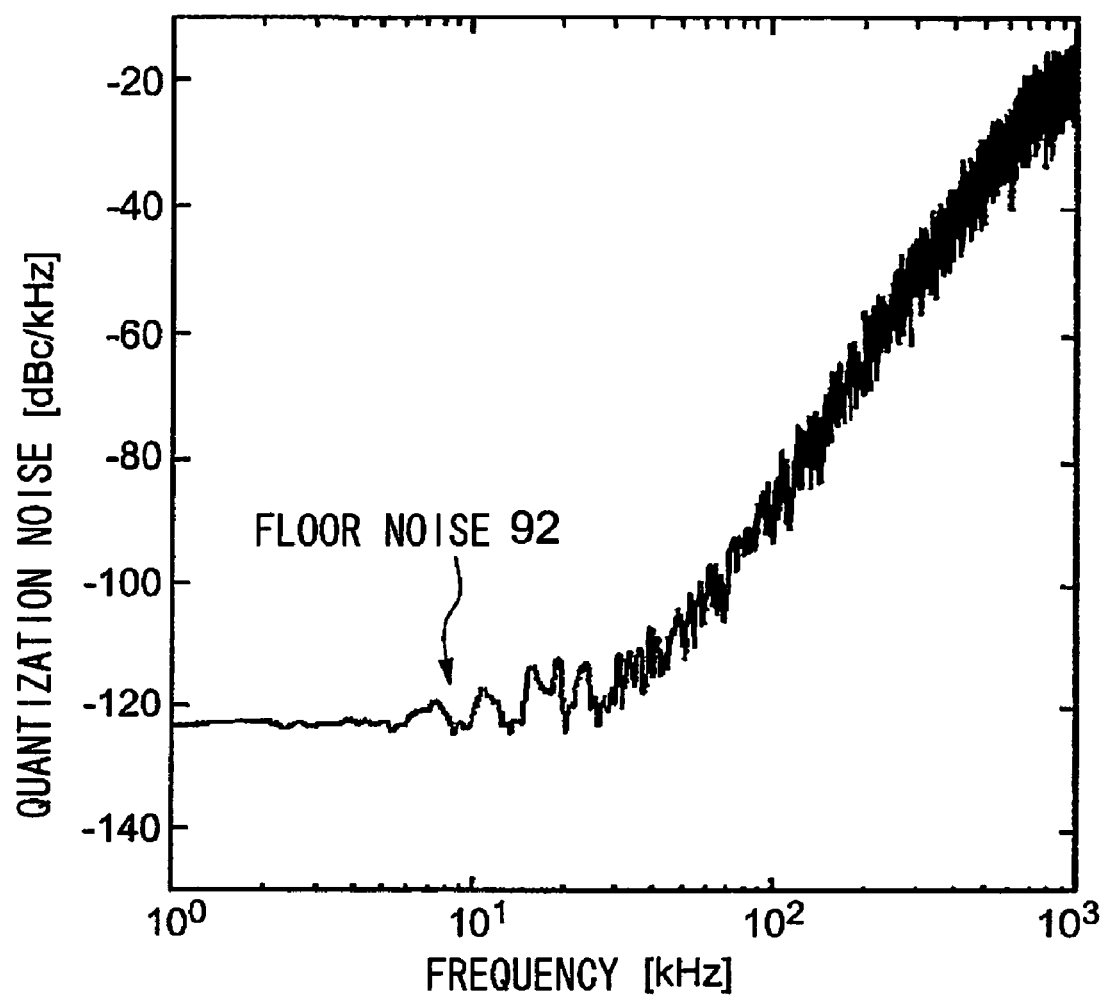
FIG. 9 is a diagram useful in describing the frequency-quantization noise characteristic of the signal processing apparatus according to the present invention.

Referring to FIGS. 7 through 9, explanations regarding an output spectrum of the signal processing apparatus according to the present invention will be made. FIG. 7 shows the quantized noise spectrum of the signal processing apparatus according to the conventional configuration shown in FIG. 4. The degree of the sigma-delta modulator is fourth order, the number of bits of input signal is 20, and the clock frequency is 2.4 MHz. The slope of the quantization noise is 80 db/dec, quadruple of 20 db/dec because the degree of the sigma-delta modulator is fourth order.

Figure 10:
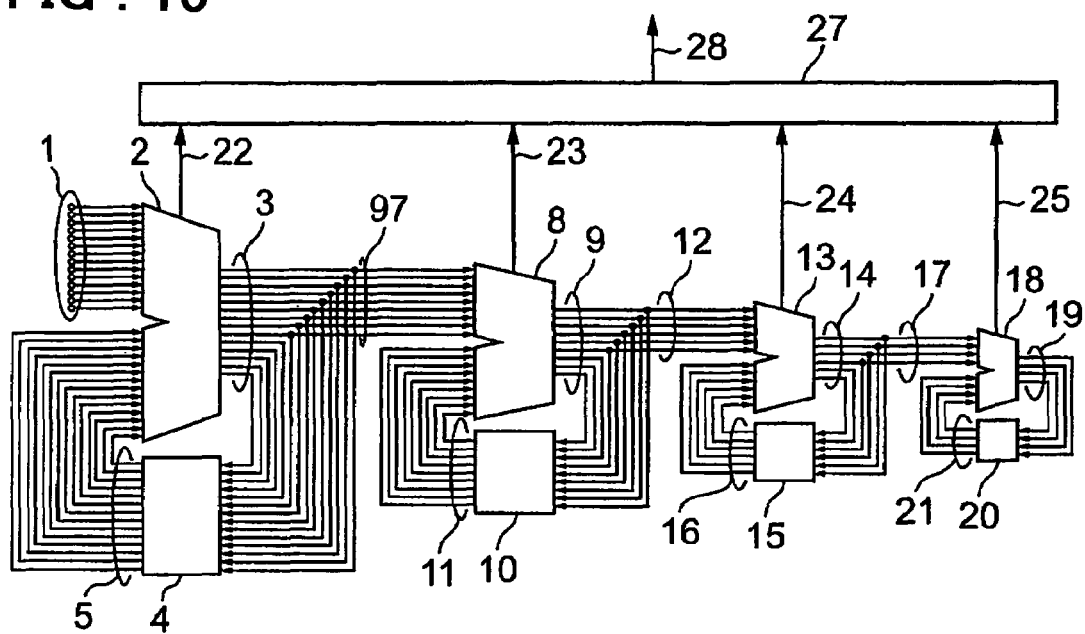
FIG. 10 is a block diagram showing a third embodiment of the signal processing apparatus according to the present invention.

FIG. 10 is a block diagram showing a third embodiment of the signal processing apparatus according to the present invention. FIG. 8 shows the quantized noise spectrum of the signal processing apparatus according to the configuration shown in FIG. 10. The configuration shown in FIG. 10 is nearly identical to the example according to the present invention shown in FIG. 1 except for the fact that the input terminal 7, which is the input into the second-stage accumulator, is omitted and substituted with the output of the accumulator 2. The numbers of bits of each accumulator are 20 bit, 9 bits, 6 bit, and 4 bit, from left to right in FIG. 10.

Compared with the spectrum according to the conventional technology in FIG. 7, by reducing the number of bits of accumulators cascade-connected in multi-stages, the quantization noise of the area below 30 KHz becomes flat. In FIG. 8, this is indicated as floor noise 91. In the area above 30 KHz, a slope of 80 db/dec is obtained as in the conventional technology, however, some unwanted line spectral indicated as spuriousness 89 and 90 appear in FIG. 8.

Regarding increases in floor noise in low frequency area, in the case of FIG. 8, this floor noise is by at least 120 db lower compared with a maximum output level. Therefore, it can be ignored in audio applications. Also, floor noise level depends on the clock frequency and the way of reducing the number of bits of accumulators cascade-connected in multi-stages.

Therefore, by corresponding to the specifications required in the fields where the present invention is applied and optimally designing a way of reducing the number of bits of accumulators, it is possible to keep the floor noise down to the level where it can be ignored.

Meanwhile, the unwanted line spectral such as the spuriousness 89 and 90 are caused by the fact that the periodicity of the output signal becomes eminent because the bit number of accumulators of later stages are small. Whether these line spectral can be ignored or not depends on the application. In cases where these unwanted line spectral do not cause any trouble in practical use, the configuration shown in FIG. 10 can be used as it is.

FIG. 9 shows the quantized noise spectrum of the signal processing apparatus according to the configuration shown in FIG. 3. As in the example in FIG. 8, a floor noise 92 appears in the area below 30 KHz. As described above, this floor noise causes no trouble in practical use and can be designed by ways of choosing the bit number of accumulators and the clock frequency.

On the other hand, unlike the example in FIG. 8, no unwanted line spectrum is observed in the area above 30 KHz. By supplying the input terminal 7 (the lowest bit input of the second-stage accumulator) with the signal obtained by inputting a signal 29 (lower 3 bits of the fourth-stage accumulator 18) into the 3-input NAND gate 30, no clear periodicity is observed in the output signal. As a result, the occurrence of unwanted line spectrum is suppressed. A similar effect can be realized by connecting an external signal source that generates 0s and 1s randomly to the input terminal 7 in the configuration shown in FIG. 1.

After being first-order differentiated at the signal processing part 27, the overflow signal 23 of the 9-bit accumulator 8 to which the input terminal 7 is connected is added to overflow signals of other accumulators or their differential signals and then outputted from the terminal 28. Therefore, the signal component inputted into the input terminal 7 does not affect the direct current component of the signal outputted from the terminal 28.

With the configuration described above, the same functionality as that of high order sigma-delta modulator according to the conventional technology can be achieved with a smaller circuit scale. Also, by applying feedback to the lowest bit input of the input of the second-stage accumulator from an output of an accumulator of later stage, unwanted line spectra caused by sequentially reducing the number of stages of cascade-connected accumulators can be suppressed.

Figure 6:
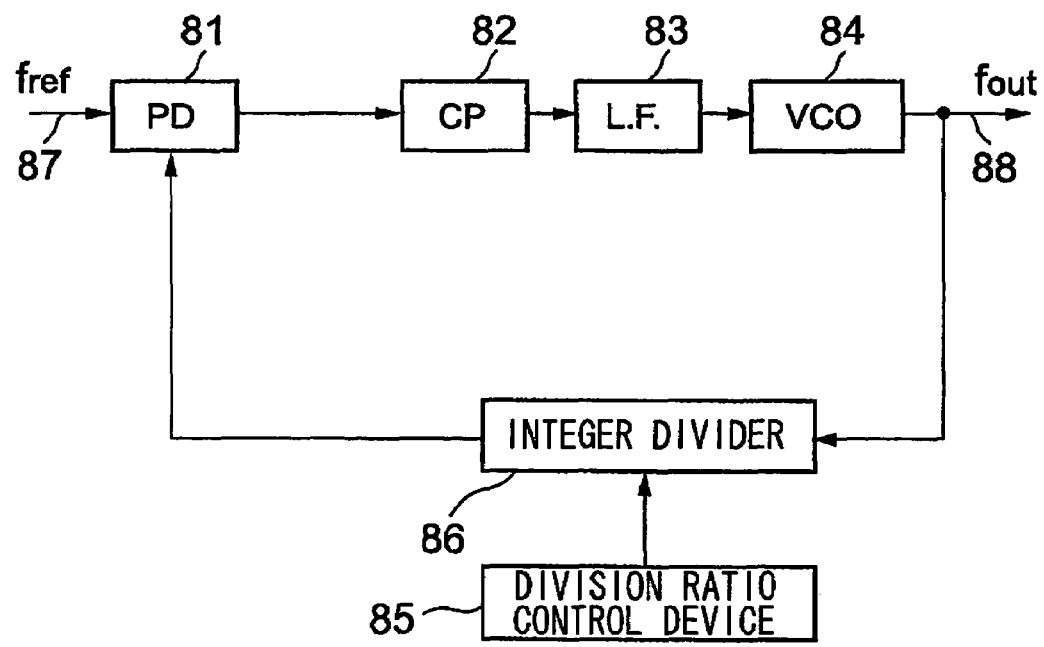
FIG. 6 is a block diagram showing the configuration of a fractional N-PLL synthesizer.

The advantages described above can be obtained with the fractional N-PLL synthesizer utilizing the present invention for its division ratio control part. In this case, the signal processing apparatuses according to the configurations shown in FIGS. 1 and 3 are used as the division ratio control device 85 in FIG. 6. As a result, a smaller circuit scale than that of the division ratio control device according to the conventional technology can be achieved. Also, with PLL synthesizer, unwanted line spectra such as the spuriousness 89 and 90 cause unwanted spuriousness in its output. This can be suppressed by connecting an external signal source that generates 0s and 1s randomly to the lowest bit of the second-stage accumulator as in the configuration shown in FIG. 1 or applying feedback to the lowest bit of the second-stage accumulator input from an output of an accumulator of later stage as in the configuration shown in FIG. 3.

Figure 11:
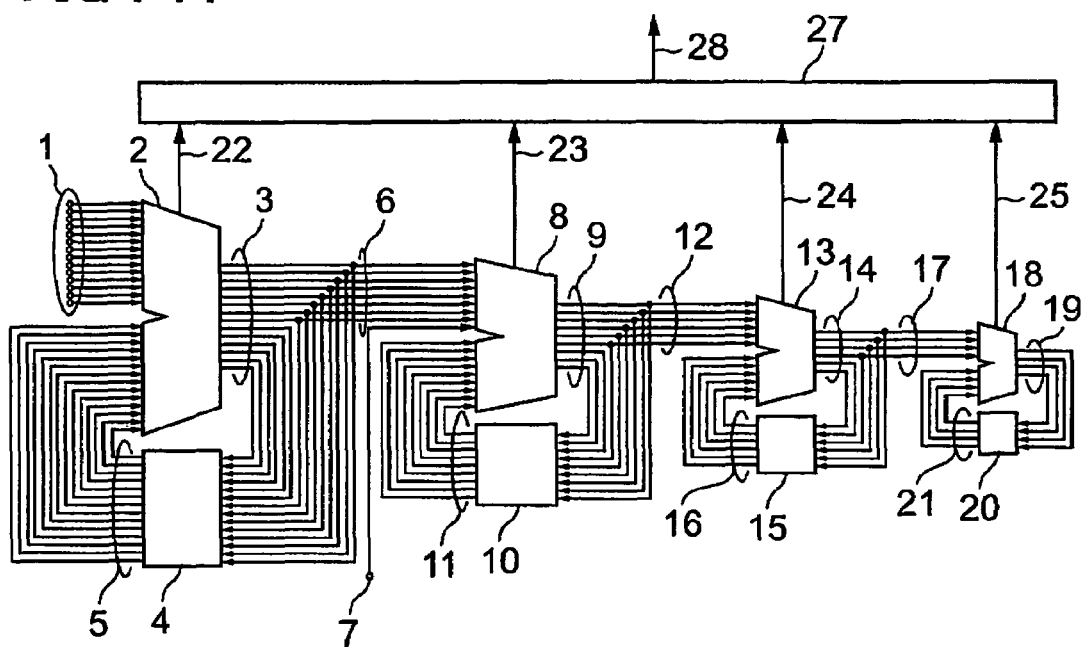
FIG. 11 is a block diagram showing a fourth embodiment of the signal processing apparatus according to the present invention.

FIG. 11 is a block diagram showing a fourth embodiment of the signal processing apparatus according to the present invention. An external signal is inputted into a terminal 1. On the surface, this apparatus appears to be the same as the one shown in FIG. 1, however, the bit number of the terminal 1 is 14 bit. A 14-bit input adder 2 and a 14-bit delay device 4 constitute a 14-bit input accumulator. The input of this 14-bit input accumulator is a 14-bit signal inputted into the signal terminal 1.

A 9-bit input adder 8 and a 9-bit delay device 10 constitute a 9-bit input accumulator. Into higher 8 bits of the 9 bits input of this accumulator, higher 8 bits of an output of the 14-bit accumulator comprising the adder 2 and the delay device 4 are inputted. A terminal 7 is connected to the remaining lowest bit.

A 6-bit input adder 13 and a 6-bit delay device 15 constitute a 6-bit input accumulator. Higher 6 bits of an output signal of the adder 8 are inputted into this 6-bit input accumulator.

A 4-bit input adder 18 and a 4-bit delay device 20 constitute a 4-bit input accumulator. Higher 4 bits of an output signal of the adder 13 are inputted into this 4-bit input accumulator.

Overflow signals 22, 23, 24, and 25 of the respective accumulator are inputted into a signal processing part 27. At the signal processing part 27, an adder 48 sums the overflow signal 22, the result of first order differentiation of the overflow signal 23, the result of second order differentiation of the overflow signal 24, and the result of third order differentiation of the overflow signal 25, and then outputs the summing result from a terminal 28.

A whole block comprised of the four accumulators and the signal processing part 27 constitutes a signal processing apparatus. Its input terminal is 1, and output terminal is 28. Also, the input terminal 7 is a terminal for connecting a signal source that generates 0s and 1s randomly.

As explained above, by connecting a signal source that generates 0s and 1s randomly, unwanted line spectra found in the output of this signal processing apparatus can be suppressed.

Figure 12:
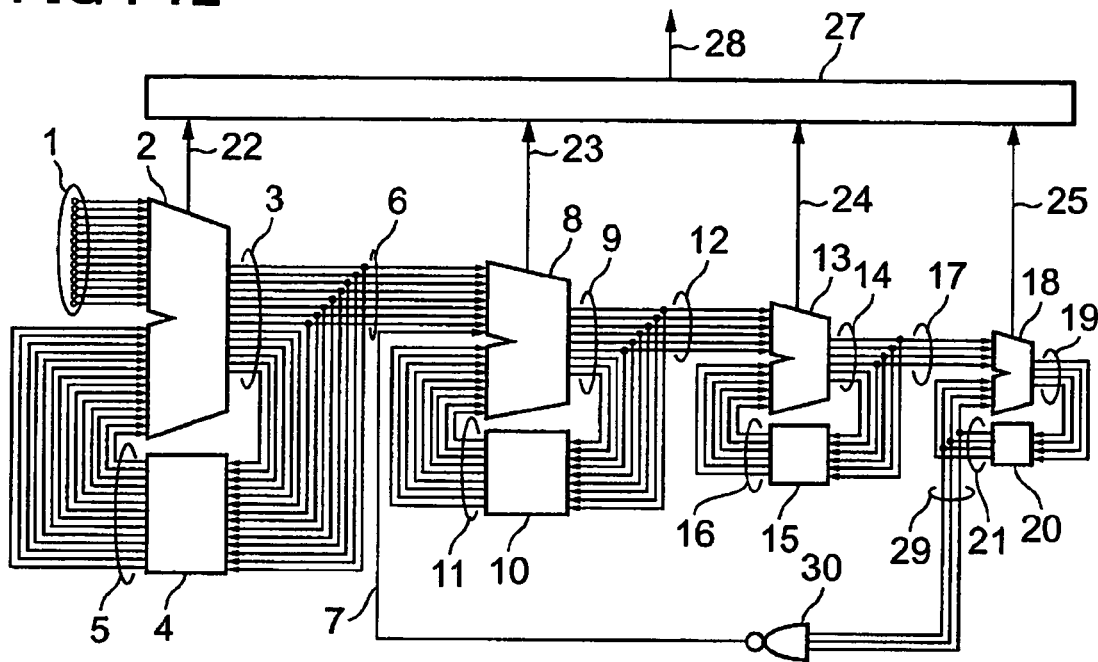
FIG. 12 is a block diagram showing a fifth embodiment of the signal processing apparatus according to the present invention.

FIG. 12 is a block diagram showing a fifth embodiment of the signal processing apparatus according to the present invention. This embodiment has a configuration nearly identical to the fourth embodiment shown in FIG. 11. The difference is the fact that an output signal of a 3-input NAND gate 30 is inputted into the input terminal 7, which is the lowest bit input of the 9-bit input accumulator 8. Lower 3 bits of output data of the 4-bit delay device 20 are inputted into the 3-input NAND gate 30. This means that the output of the NAND gate 30, whose input is lower 3 bits of the output signal of the delay device 20 (a one-clock delayed output signal of the accumulator 18), is inputted into the input terminal 7, instead of the external signal source in FIG. 11 that is connected to the input terminal 7 and generates 0s and 1s randomly.

Figure 13:
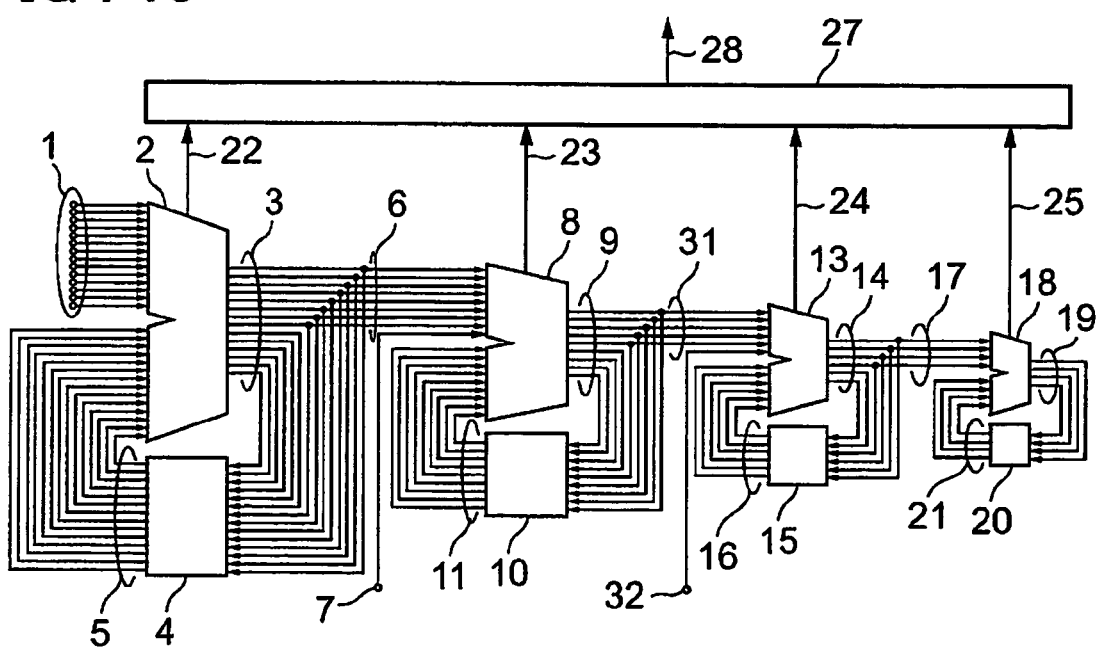
FIG. 13 is a block diagram showing a sixth embodiment of the signal processing apparatus according to the present invention.

FIG. 13 is a block diagram showing a sixth embodiment of the signal processing apparatus according to the present invention. This embodiment has a configuration nearly identical to the fourth embodiment shown in FIG. 11. The difference is the fact that the lowest bit input of a 6-bit input first order sigma-delta modulator comprising the adder 13 and delay device 15 is taken out to the outside as a input terminal 32. The input terminal 7 and this input terminal 32 are terminals for connecting an external signal source that generates 0s and 1s randomly.

Figure 14:
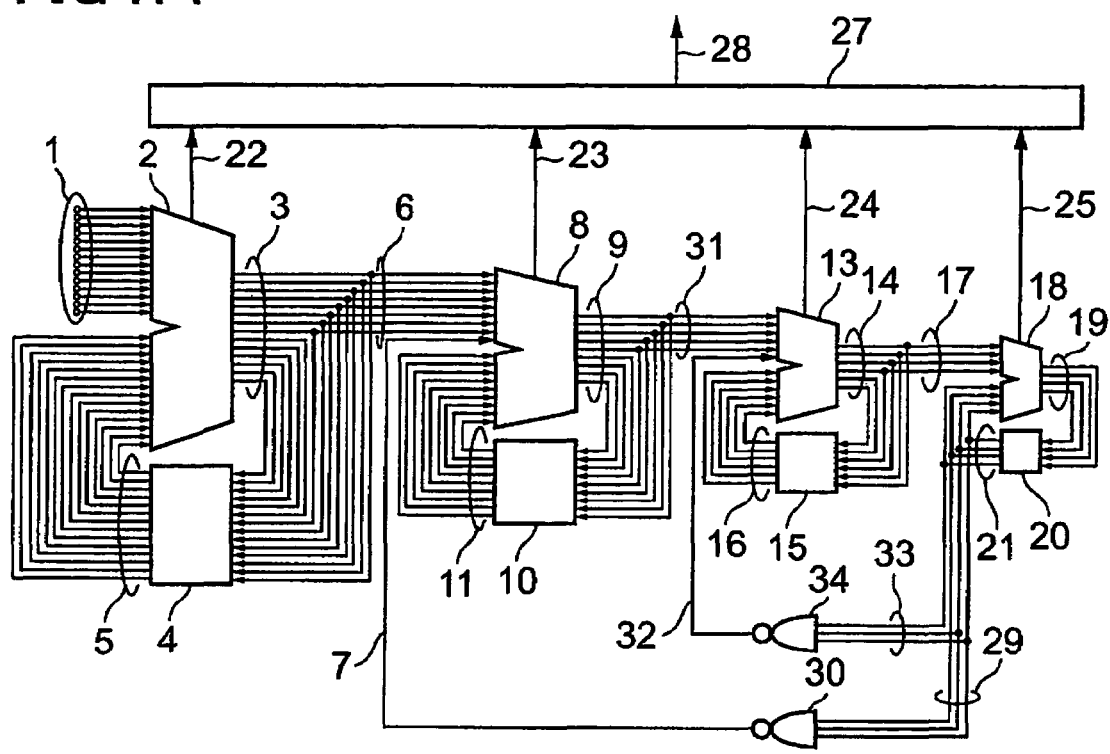
FIG. 14 is a block diagram showing a seventh embodiment of the signal processing apparatus according to the present invention.

FIG. 14 is a block diagram showing a seventh embodiment of the signal processing apparatus according to the present invention. The fourth embodiment shown in FIG. 14 has a configuration nearly identical to the sixth embodiment shown in FIG. 13. The difference resides in the fact that the output signal of the 3-input NAND gate 30 is inputted into the input terminal 7, which is the lowest bit input of the 9-bit input accumulator 8, and the output signal of a 3-input NAND gate 34 is inputted into the input terminal 32, which is the lowest bit input of a 6-bit input accumulator 13. In addition, lower 3 bits of output data of the 4-bit delay device 20 are inputted into the 3-input NAND gate 30, and higher 3 bits of output data of the 4-bit delay device 20 are inputted into the 3-input NAND gate 34. This means that the signal obtained by inputting a one-clock delayed output signal of the accumulator 18 into the 3-input NAND gates 30 and 34 is used in place of the signal connected to the input terminals 7 and 32 that generates 0s and is randomly in FIG. 13.

A first example of the signal processing part 27 according to the first through seventh embodiments can be exactly the same as the signal processing part 27 described in FIG. 2. Therefore, illustrations and detailed description are omitted here, but in short, the signal processing part 27 sums the overflow signal 22, the result of first order differentiation of the overflow signal 23, the result of second order differentiation of the overflow signal 24, and the result of third order differentiation of the overflow signal 25, and then outputs the summing result from the terminal 28.

Figure 15:
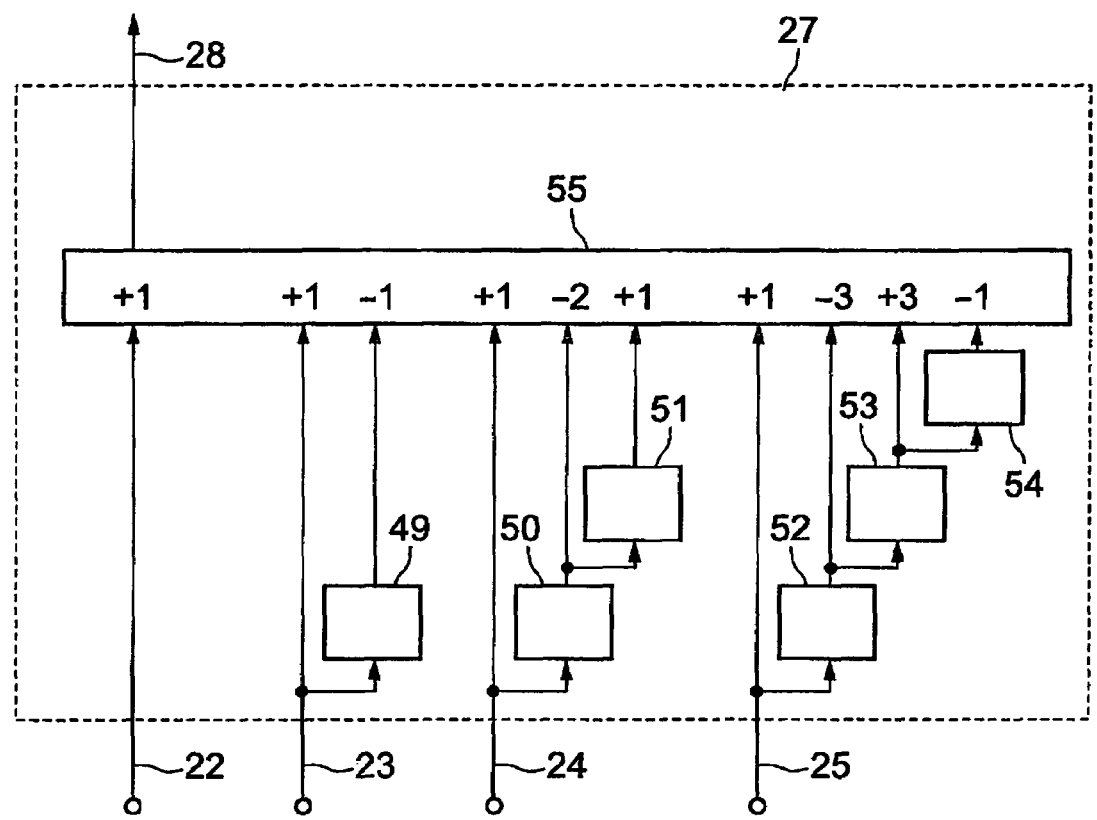
FIG. 15 is a circuit diagram showing a second example of the signal processing part of the signal processing apparatus according to the present invention.

FIG. 15 shows a second example of the signal processing part 27. 49, 50, 51, 52, and 53 are delay devices. A signal processing device 55 sums the values of the overflow signals 22, 23, 24, and 25, the value of an output of the delay device 49 multiplied by-1, the value of an output of the delay device 50 multiplied by-2, an output value of the delay device 51, the value of an output of the delay device 52 multiplied by-3, the value of an output of the delay device multiplied 53 by 3, and the value of an output of the delay device 54 multiplied by-1, and then outputs the summing result from the terminal 28. The functions of summing carry signals, i.e. the overflow signal 22, the result of first order differentiation of the overflow signal 23, the result of second order differentiation of the overflow signal 24, and the result of third order differentiation of the overflow signal 25, and then outputting the summing result from the terminal 28 can be realized with this configuration as well.

Figure 16:
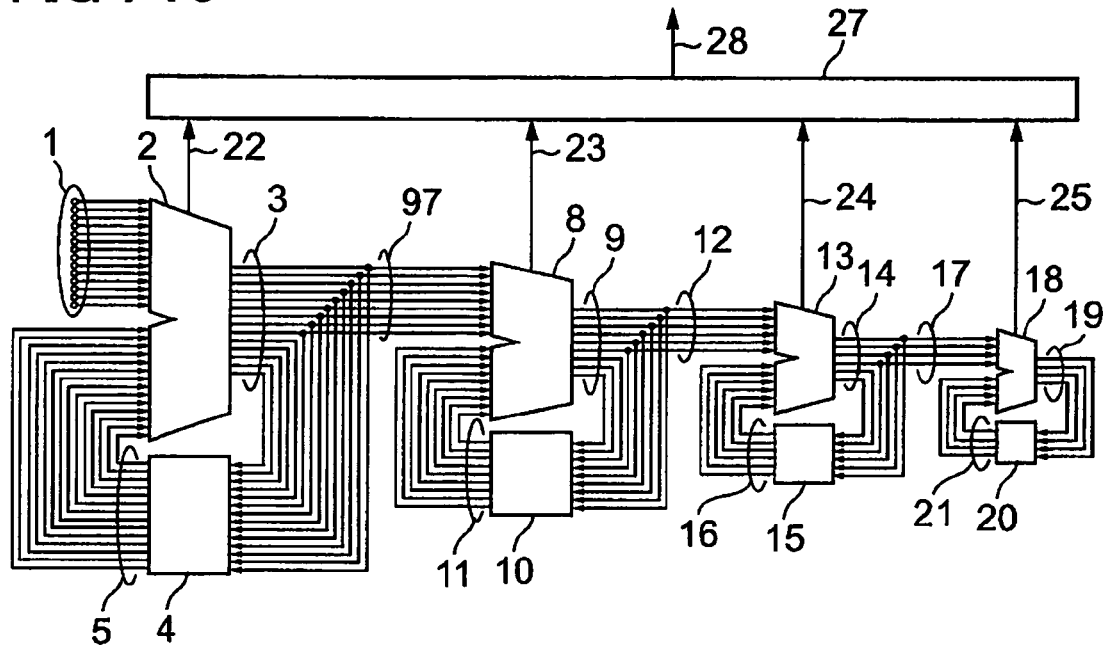
FIG. 16 is a block diagram showing a eighth embodiment of the signal processing apparatus according to the present invention.

FIG. 16 is a block diagram showing a eighth embodiment of the signal processing apparatus according to the present invention. A terminal 1 is the terminal that an external signal is inputted into. The number of bits of the terminal 1 is 14 bits. A 14-bit input adder 2 and a 14-bit delay device 4 constitute a 14-bit input accumulator. An input signal of this 14-bit accumulator is a 14-bit signal inputted from the terminal 1.

A 9-bit input adder 8 and a 9-bit delay device 10 constitute a 9-bit input accumulator. Into this accumulator, higher 9 bits of an output of the 14-bit accumulator comprising the adder 2 and the delay device 4, are inputted.

A 6-bit input adder 13 and a 6-bit delay device 15 constitute a 6-bit input accumulator. Higher 6 bits of an output signal of the adder 8 are inputted into this 6-bit input accumulator.

A 4-bit input adder 18 and a 4-bit delay device 20 constitute a 4-bit input accumulator. Higher 4 bits of an output signal of the adder 13 are inputted into this 4-bit input accumulator.

Overflow signals 22, 23, 24, and 25 of the respective accumulator are inputted into a signal processing part 27. The signal processing part 27 sums the overflow signal 22, the result of first order differentiation of the overflow signal 23, the result of second order differentiation of the overflow signal 24, and the result of third order differentiation of the overflow signal 25, and then outputs the summing result from a terminal 28.

A whole block comprising of the four accumulators and the signal processing part 27 constitutes a signal processing apparatus. Its input terminal is 1, and output terminal is 28.

Figure 17:
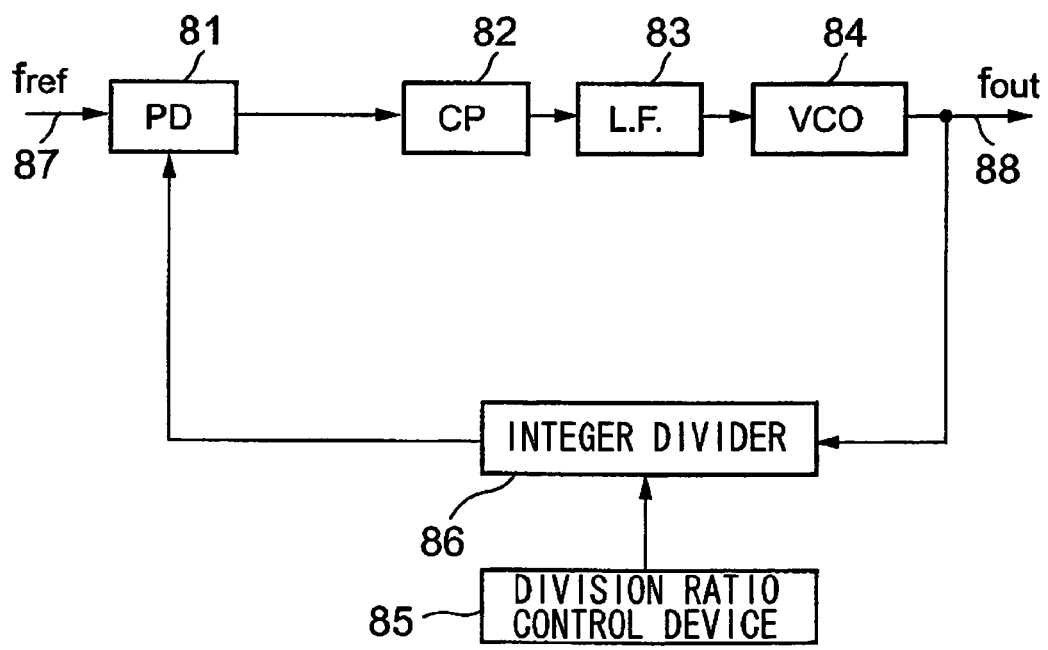
FIG. 17 is a block diagram showing a first embodiment of the fractional N-PLL synthesizer utilizing the signal processing apparatus according to the present invention.

FIG. 17 shows an explanatory diagram concerning a first embodiment of the fractional N-PLL synthesizer utilizing the signal processing apparatus according to the present invention. The output of a VCO 84 is split into two signals. One becomes a final output 88 of the PLL synthesizer, and the other is inputted into an integer divider 86. The output divided by the integer divider 86 is inputted into a phase comparator (PD hereafter) 81. As the other input, a reference signal 87 is inputted into the PD 81, and the phase difference between the reference signal 87 and the output signal of the integer divider 86 is outputted to a charge pump(CP hereafter) 82. The CP 82 converts the phase difference information it receives into current or voltage, which is fed back to the VCO 84 after passing through a loop filter (L.F. hereafter) 83. By the function of this feedback, the frequency of the signal that the VCO 84 outputs is locked to a frequency of the reference signal 87 multiplied by a division ratio. By having the division ratio control device 85 according to the present invention control the frequency division ratio of the integer divider 86 over time, non-integer division ratio is realized as a time average value. As a result, it is possible to make the output frequency of the VCO 84 a value of a reference frequency f ref multiplied by a non-integer.

Furthermore, it is evident that, if only the integer divider 86 and division ratio divider 85 are taken out from the block shown in FIG. 17, it will operate as a non-integer divider.

Figure 18:
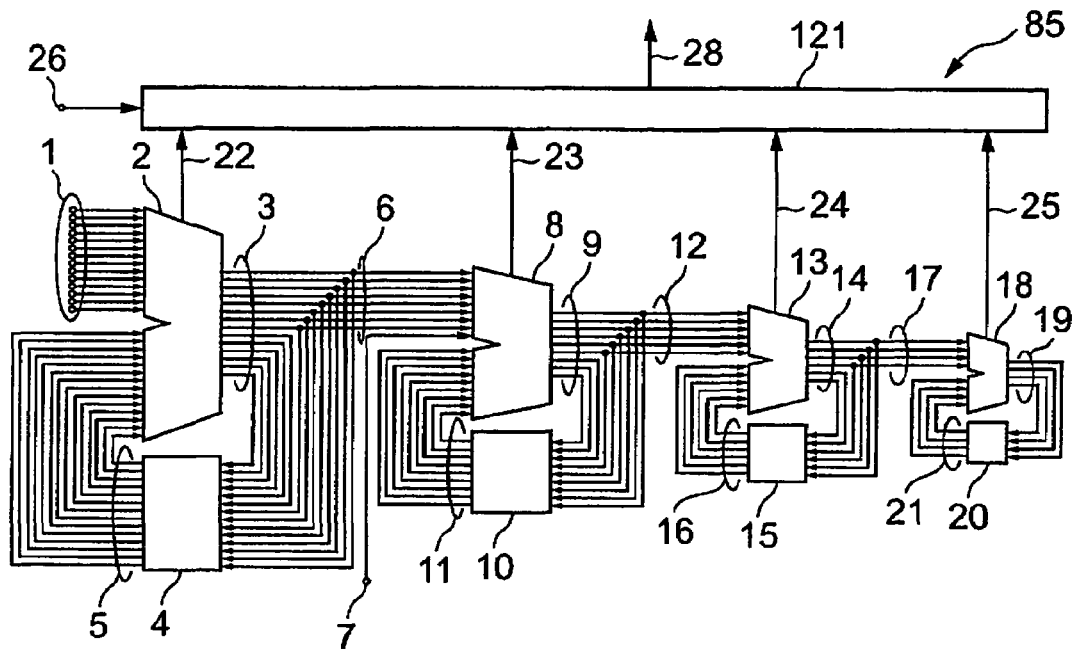
FIG. 18 is a circuit diagram showing a first embodiment of the division ratio controller according to the present invention.

FIG. 18 shows a circuit diagram concerning a first embodiment when the signal processing apparatus according to the present invention is regarded as the division ratio control device 85. This embodiment has a configuration nearly identical to the one shown in FIG. 11. The difference resides in the fact that a signal processing part 121 comprises a signal input terminal 26. The signal processing part 121 sums a value inputted from the input terminal 26, an overflow signal 22, the result of first order differentiation of an overflow signal 23, the result of second order differentiation of an overflow signal 24, and the result of third order differentiation of an overflow signal 25, and then outputs the summing result from a terminal 28.

By inputting the integer part of a desired division ratio into the signal input terminal 26 and the fraction part data of a desired division ratio into a signal input terminal 1, an integer value that changes with time is outputted to the output terminal 28. Its time average value is equal to the numerical value of the desired non-integer division ratio. By inputting this signal that appears in the output terminal 28 into the integer divider 86 (FIG. 17) as division ratio setting information and have it change the integer division ratio of the integer divider 86 over time, an operation of non-integer division is realized.

Since means for dividing a non-integer division ratio into an integer part and fractional part and distributing them into the input terminals 26 and 1 respectively is the same as the one used in the fractional N-PLL synthesizer according to the conventional technology, no detailed explanation is necessary.

Figure 19:
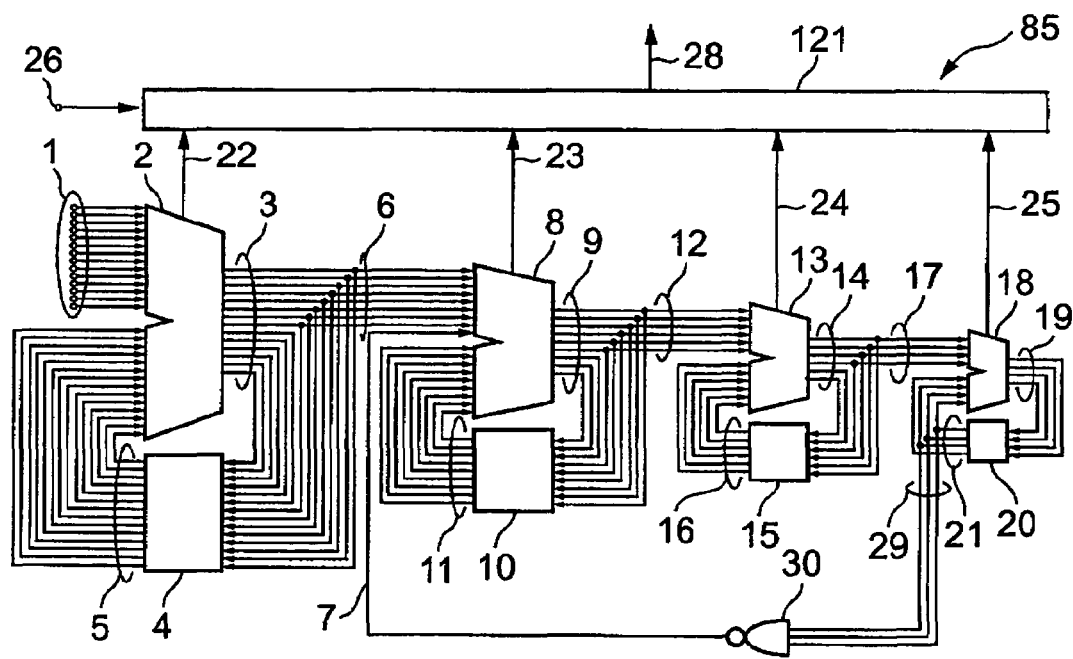
FIG. 19 is a circuit diagram showing a second embodiment of the division ratio controller according to the present invention.

FIG. 19 shows a circuit diagram concerning a second embodiment of the division ratio control device 85 according to the present invention. This embodiment has a configuration nearly identical to the fifth embodiment of the signal processing apparatus shown in FIG. 12. The difference is the fact that a signal processing part 121 comprises a signal input terminal 26. The signal processing part 121 sums a value inputted from the input terminal 26, an overflow signal 22, the result of first order differentiation of an overflow signal 23, the result of second order differentiation of an overflow signal 24, and the result of third order differentiation of an overflow signal 25, and then outputs the summing result from a terminal 28.

Figure 20:
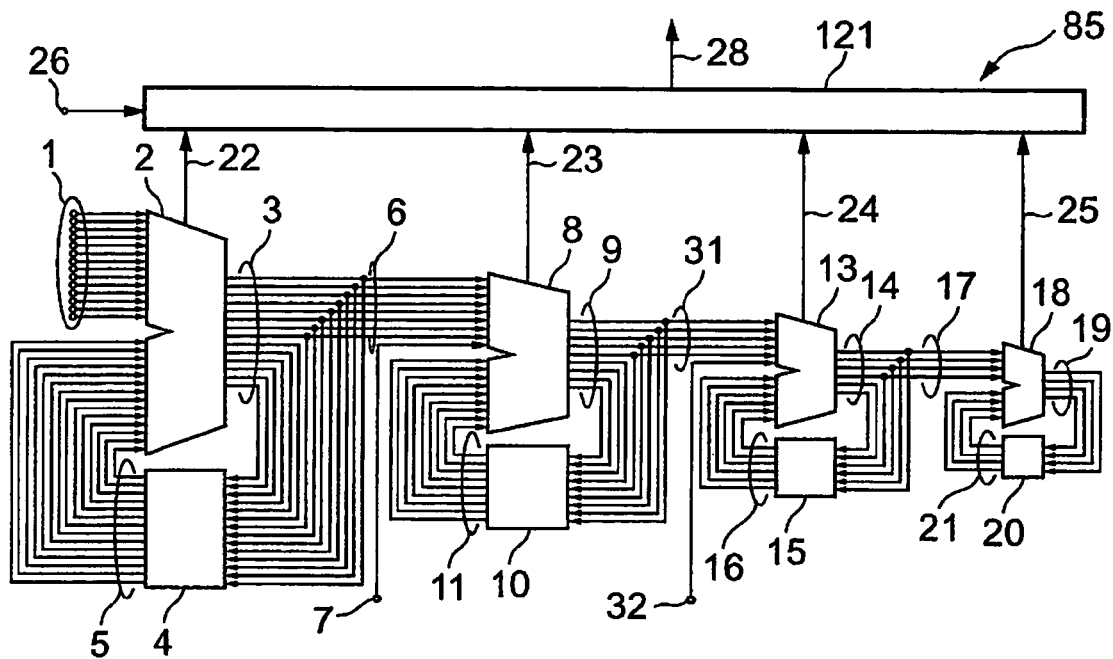
FIG. 20 is a circuit diagram showing a third embodiment of the division ratio controller according to the present invention.

FIG. 20 shows a circuit diagram concerning a third embodiment of the division ratio control device 85 according to the present invention. This embodiment has a configuration nearly identical to the sixth embodiment of the signal processing apparatus shown in FIG. 13. The difference is the fact that a signal processing part 121 comprises a signal input terminal 26. The signal processing part 121 sums a value inputted from the input terminal 26, an overflow signal 22, the result of first order differentiation of an overflow signal 23, the result of second order differentiation of an overflow signal 24, and the result of third order differentiation of an overflow signal 25, and then outputs the summing result from a terminal 28.

Figure 21:
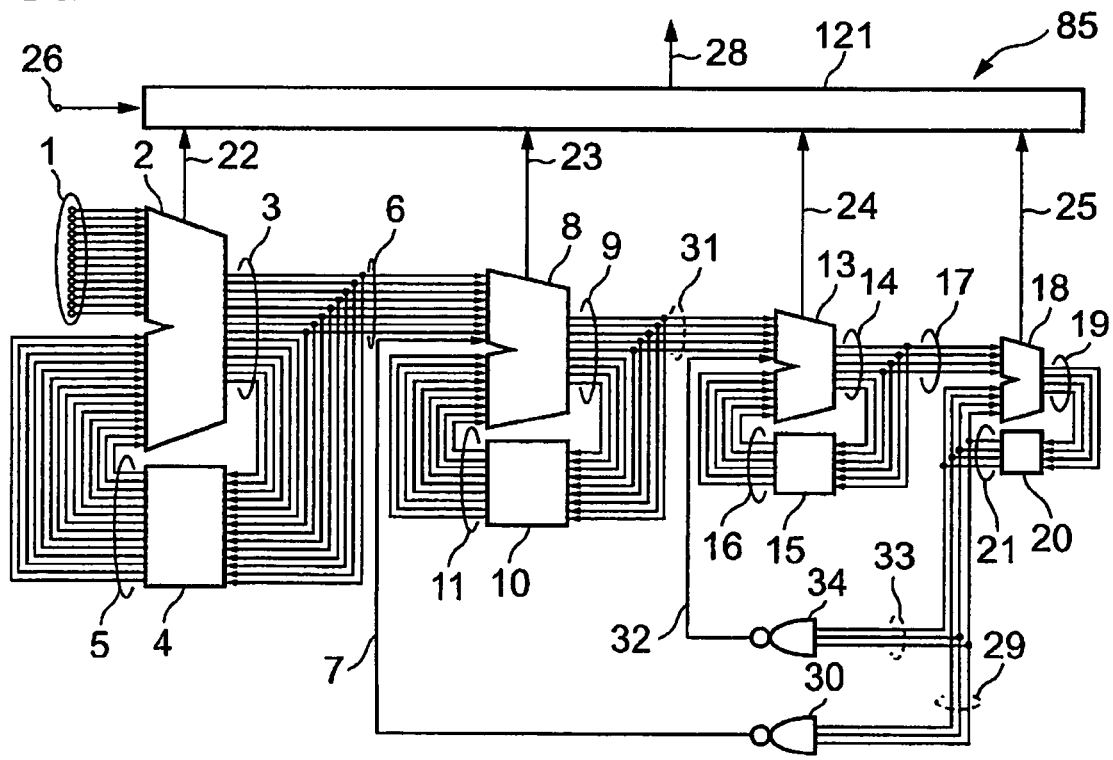
FIG. 21 is a circuit diagram showing a fourth embodiment of the division ratio controller according to the present invention.

FIG. 21 shows a circuit diagram concerning a fourth embodiment of the division ratio control device 85 according to the present invention. This embodiment has a configuration nearly identical to the seventh embodiment of the signal processing apparatus shown in FIG. 14. The difference is the fact that a signal processing part 121 comprises a signal input terminal 26. The signal processing part 121 sums a value inputted from the input terminal 26, an overflow signal 22, the result of first order differentiation of an overflow signal 23, the result of second order differentiation of an overflow signal 24, and the result of third order differentiation of an overflow signal 25, and then outputs the summing result from a terminal 28.

Figure 22:
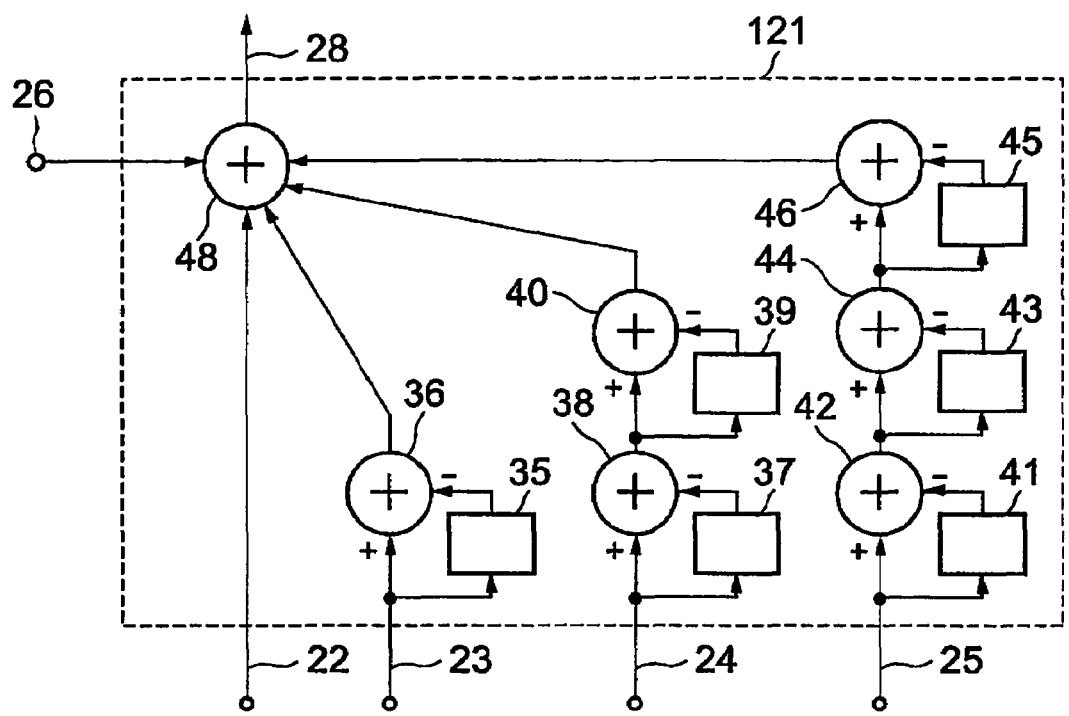
FIG. 22 is a circuit diagram showing a first example of the signal processing part of the division ratio controllers shown in FIGS. 18 through 21.

FIG. 22 shows a circuit diagram concerning a first example of the signal processing part 121 of the division ratio control device 85 according to the present invention. This example has a configuration nearly identical to the first example of the signal processing part described above, i.e. the signal processing part 27 shown in FIG. 2. The difference resides in the fact that an adder 48 sums a signal supplied to a signal input terminal 26, an overflow signal 22, the result of first order differentiation of an overflow signal 23, the result of second order differentiation of an overflow signal 24, and the result of third order differentiation of an overflow signal 25.

Figure 23:
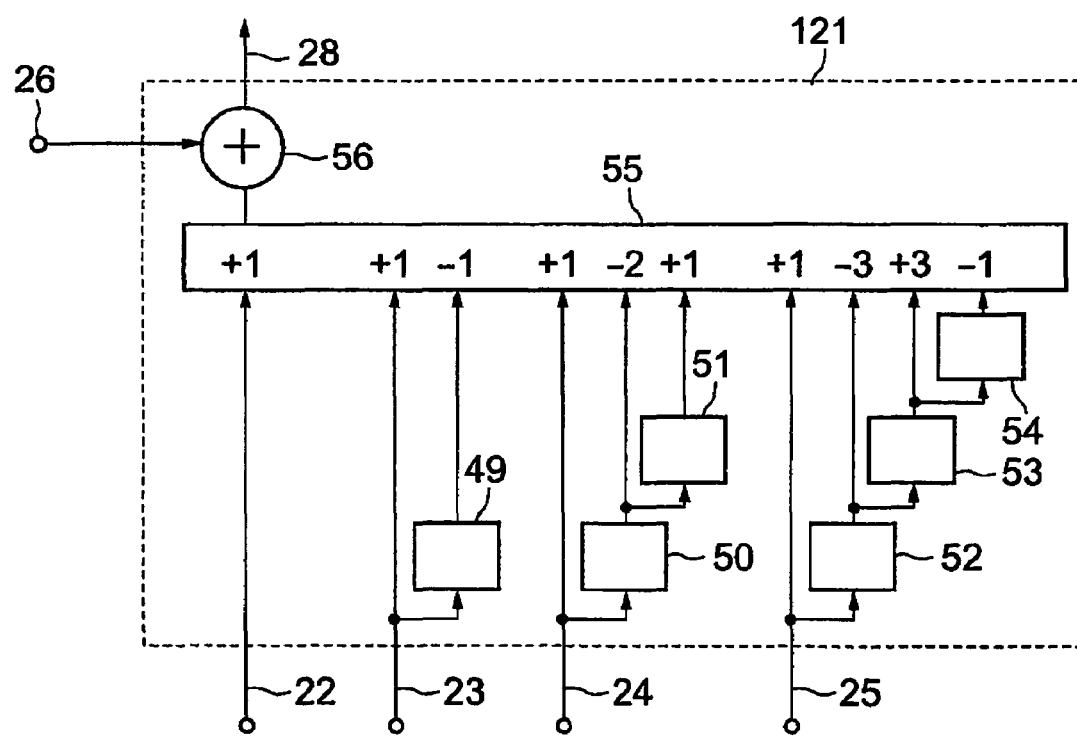
FIG. 23 is a circuit diagram showing a second example of the signal processing part of the division ratio controllers shown in FIGS. 18 through 21.

FIG. 23 shows a circuit diagram concerning a second example of the signal processing part 121 of the division ratio control device 85 according to the present invention. This example has a configuration nearly identical to the second example of the signal processing part 27 shown in FIG. 15. The difference resides in the fact that an adder 56 sums an output of a signal processing device 55 and a signal supplied to a signal input terminal 26.

Figure 24:
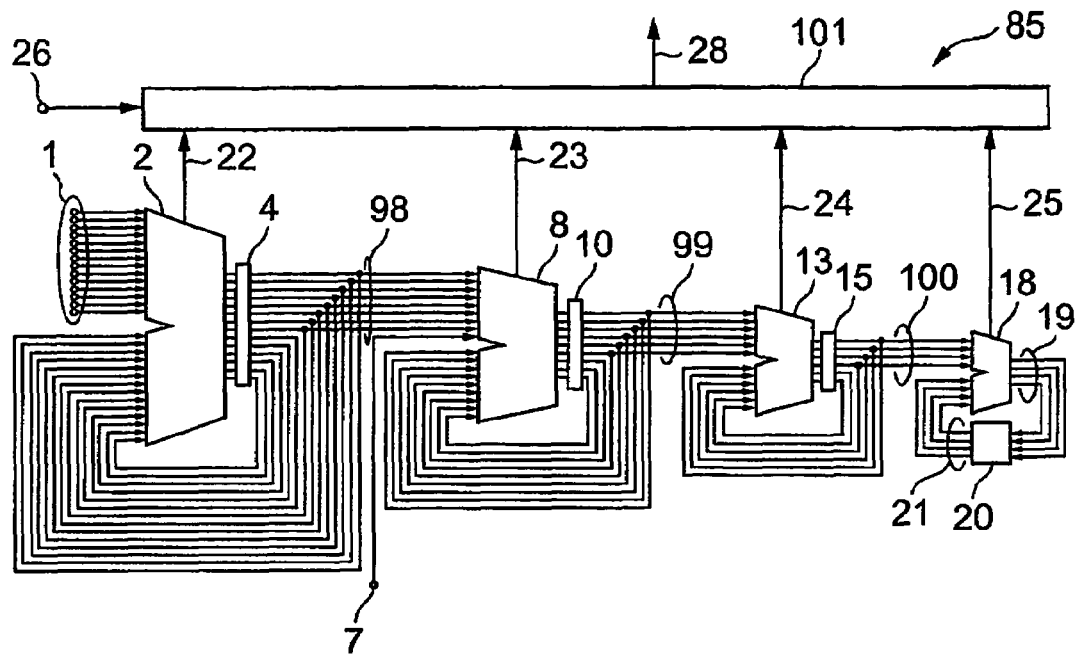
FIG. 24 is a circuit diagram showing a fifth embodiment of the division ratio controller according to the present invention.

FIG. 24 shows a circuit diagram concerning a fifth embodiment of the division ratio control device 85 according to the present invention. This embodiment has a configuration nearly identical to the fourth embodiment of the signal processing device shown in FIG. 11. The difference resides in the fact that an input of a second accumulator comprising an adder 8 and a delay device 10 is taken from an output of a delay device 4 instead of an output of an adder 2. Also, an input of a third accumulator comprising an adder 13 and a delay device 15 is taken from an output of the delay device 10 instead of an output of the adder 8. In addition, an input of a fourth accumulator comprising an adder 18 and a delay device 20 is taken from an output of the delay device 15 instead of an output of the adder 13. That is to say, higher 8 bits of a one-clock delayed output value of a first accumulator are inputted into the second accumulator, higher 6 bits of a one-clock delayed output value of the second accumulator are inputted into the third accumulator, and higher 4 bits of a one-clock delayed output value of the third accumulator are inputted into the fourth accumulator. Overflow signals 22, 23, 24, and 25 of the respective accumulator are inputted into a signal processing part 101.

The signal processing part 101 sums a value inputted from an input terminal 26, the overflow signal 22, the result of first order differentiation of the overflow signal 23, the result of second order differentiation of the overflow signal 24, and the result of third order differentiation of the overflow signal 25, and then outputs the summing result from an output terminal 28.

Figure 25:
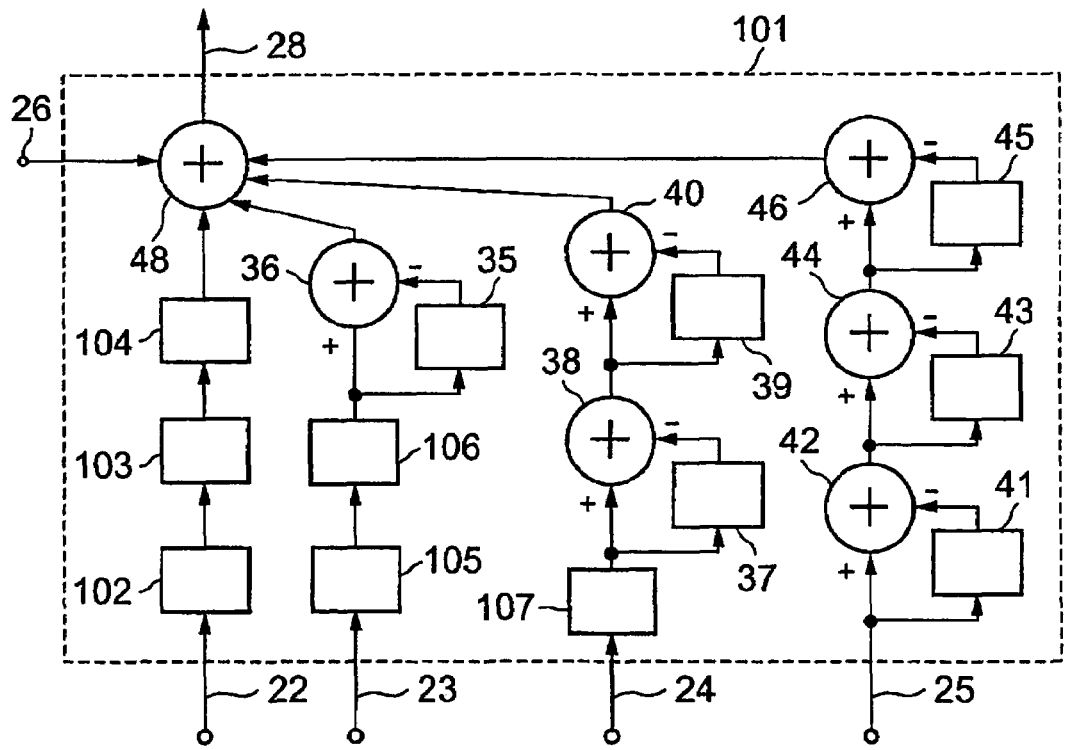
FIG. 25 is a circuit diagram showing a first example of the signal processing part of the division ratio controller shown in FIG. 24.

FIG. 25 shows a circuit diagram concerning a first example of the signal processing part 101 according to the present invention. 102, 103, 104, 105, 106, and 107 are delay devices that output their input data delayed by one clock. This configuration is identical to the one of the first example of the signal processing part 121 shown in FIG. 22 except for the fact that these delay devices are inserted. With this configuration, the signal processing part 101 sums integer part data of a division ratio inputted from the signal terminal 26, a three-clock delayed signal of the overflow signal 22, a signal obtained by delaying the result of first order differentiation of the overflow signal 23 by two clock, a signal obtained by delaying the result of second order differentiation of the overflow signal 24 by one clock, and the result of third order differentiation of the overflow signal 25, and then outputs the summing result from the output 28.

Figure 26:
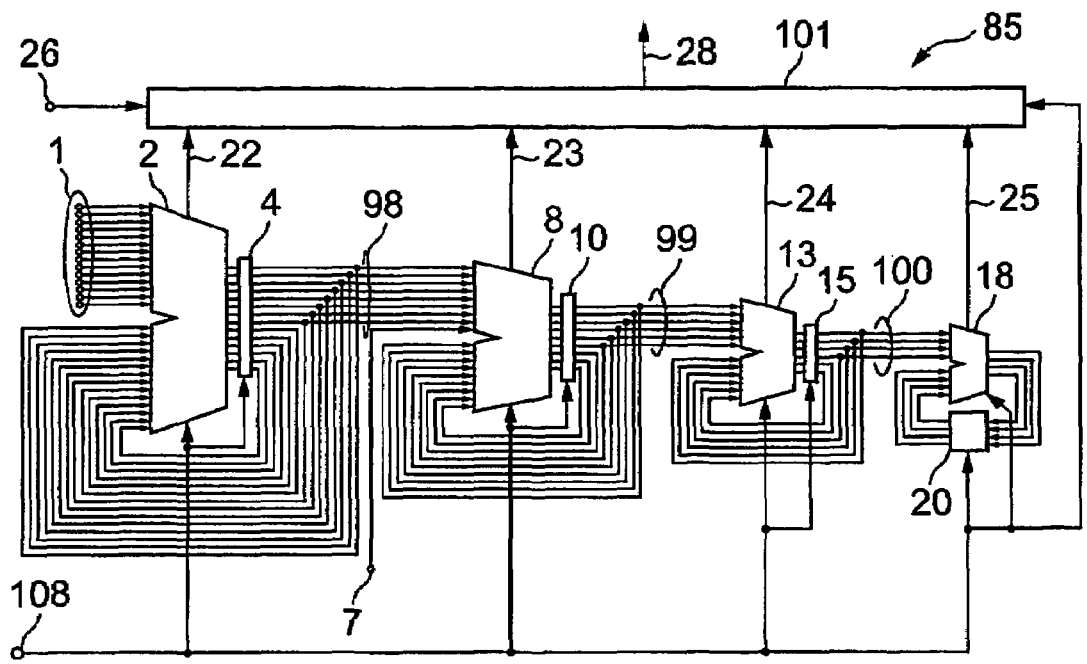
FIG. 26 is a circuit diagram showing a sixth embodiment of the division ratio controller according to the present invention.

FIG. 26 shows a circuit diagram concerning a sixth embodiment of the division ratio control device 85 according to the present invention. This embodiment shows one example of means for supplying clock in the same configuration as the one in the fifth embodiment of the division ratio control device 85 shown in FIG. 24. A Clock signal is supplied from an input terminal 108, and distributed among adders 2, 8, 13, and 18, delay devices 4, 10, 15, and 20, and a signal processing part 101. The adders 2, 8, 13, and 18 operate in synchronization with the up edge of the clock, and the delay devices 4, 10, 15, and 20, and the signal processing part 101 operate in synchronization with the down edge of the clock.

Figure 27:
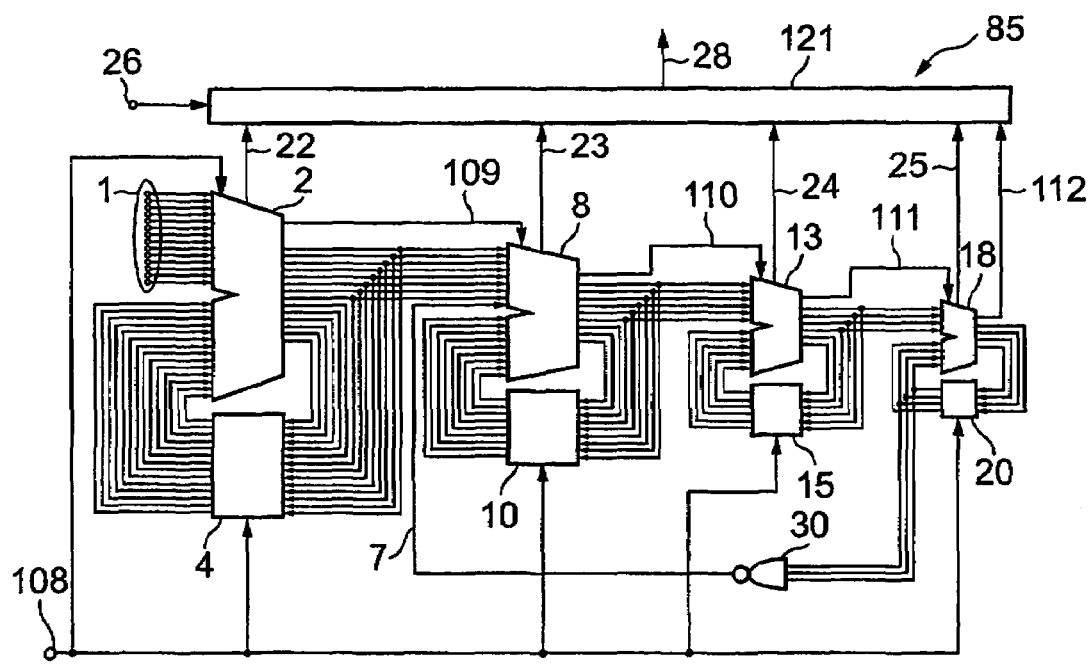
FIG. 27 is a circuit diagram showing a seventh embodiment of the division ratio controller according to the present invention.

FIG. 27 shows a circuit diagram concerning a seventh embodiment of the division ratio control device 85 according to the present invention. This embodiment shows one example of means for supplying clock in the same configuration as the one in the second embodiment of the division ratio control device 85 shown in FIG. 19. A Clock signal is supplied from an input terminal 108, and distributed among an adder 2, delay devices 4, 10, 15, and 20, and a signal processing part 121. Adders 2 and 8 are connected by a signal line 109, adders 8 and 13 are connected by a signal line 110, and adders 13 and 18 are connected by a signal line 111.

The adder 2 operates in synchronization with the rising(up) edge of the clock. When the operation of the adder 2 is completed, a signal showing the completion of the operation of the adder 2 is generated in the signal line 109. The adder 8 receives this signal and starts to operate. When the operation of the adder 8 is completed, a signal showing the completion of the operation of the adder 8 is generated in the signal line 110. The adder 13 receives this signal and starts to operate. When the operation of the adder 13 is completed, a signal showing the completion of the operation of the adder 13 is generated in the signal line 111. The adder 18 receives this signal and starts to operate.

A series of the operations of the adders 2, 8, 13, and 18 described above completes within a half cycle of the clock signal. The delay devices 4, 10, 15, and 18 and the signal processing part 121 operate in synchronization with the falling (down) edge of the clock.

Figure 28:
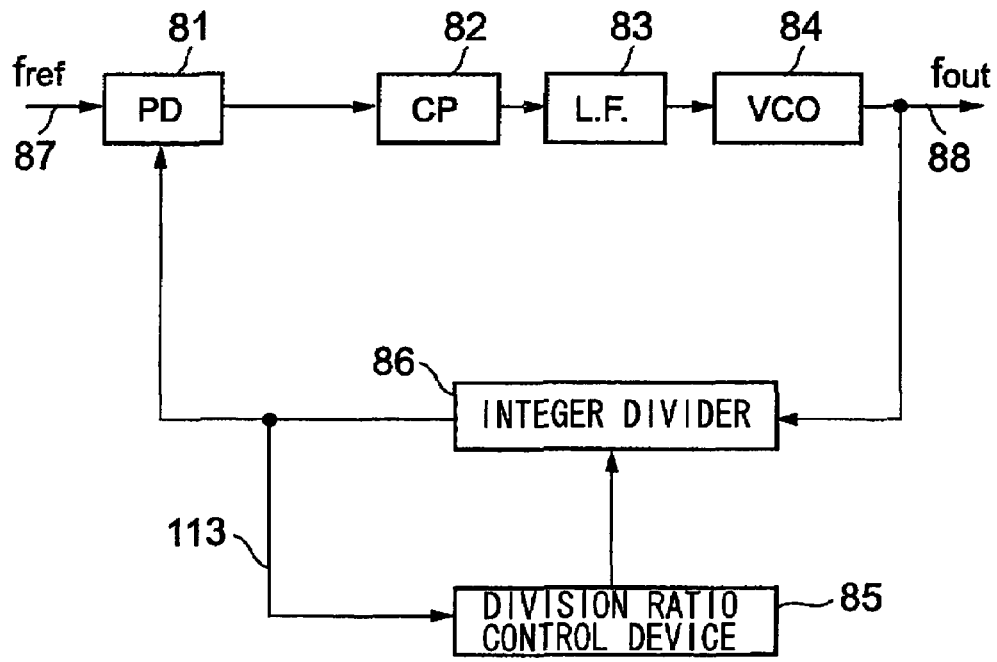
FIG. 28 is a block diagram showing a second embodiment of the fractional N-PLL synthesizer utilizing the signal processing apparatus according to the present invention.

FIG. 28 shows a block diagram concerning a second embodiment of the fractional N-PLL synthesizer utilizing the signal processing apparatus according to the present invention. This embodiment shows one example of means for supplying clock to the division ratio control device 85 in the same configuration as the one in the first embodiment of the fractional N-PLL synthesizer shown in FIG. 17. In this embodiment, the division ratio control device 85 operates using an output signal of an integer divider 86 as a clock. A buffer circuit and an inverter for inverting polarity may be provided in a clock supply line 113 to the division ratio control device 85.

Figure 29:
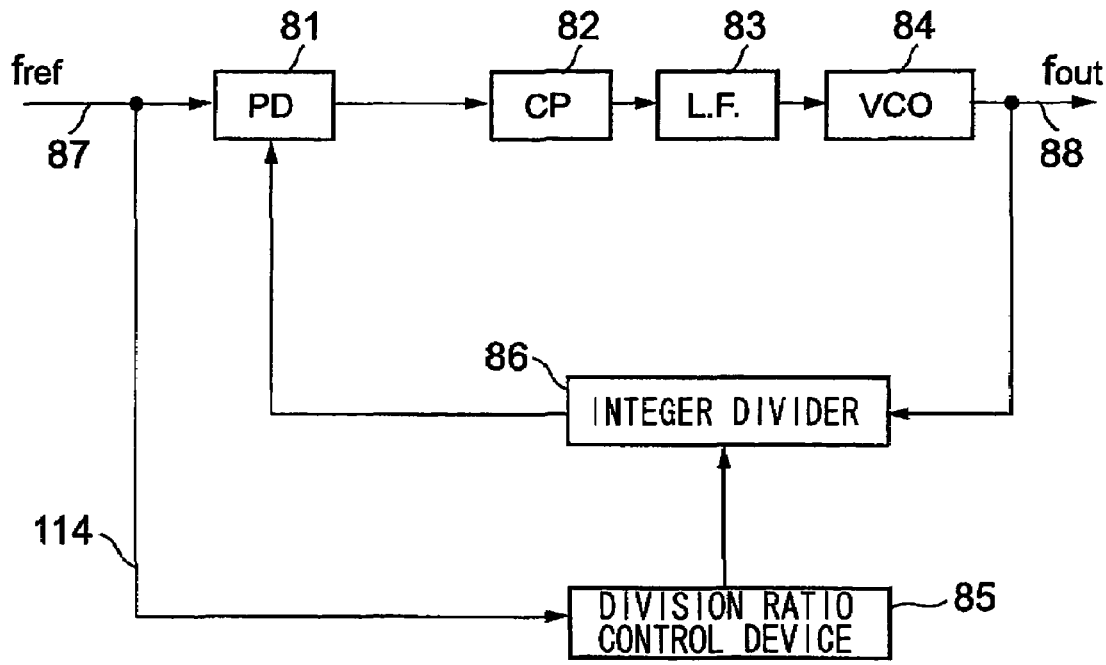
FIG. 29 is a block diagram showing a third embodiment of the fractional N-PLL synthesizer utilizing the signal processing apparatus according to the present invention.

FIG. 29 shows a block diagram concerning a third embodiment of the fractional N-PLL synthesizer utilizing the signal processing apparatus according to the present invention. In this embodiment, the division ratio control device 85 operates using a reference signal 87 as a clock. A buffer circuit and an inverter for inverting polarity may be provided in a clock supply line 114 to the division ratio control device 85.

Figure 30:
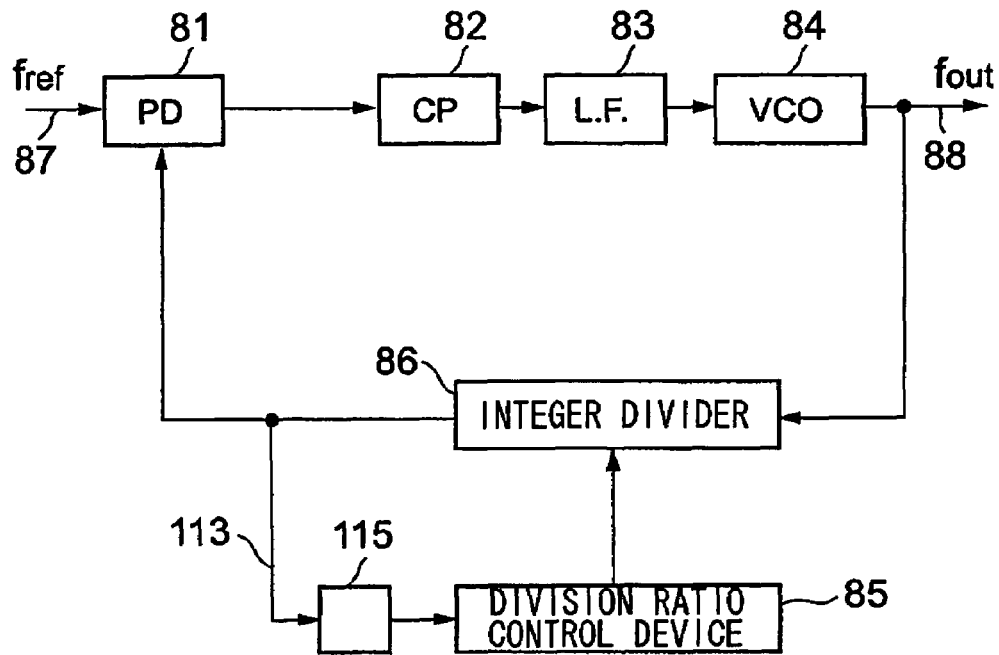
FIG. 30 is a block diagram showing a fourth embodiment of the fractional N-PLL synthesizer utilizing the signal processing apparatus according to the present invention.

FIG. 30 shows a block diagram concerning a fourth embodiment of the fractional N-PLL synthesizer utilizing the signal processing apparatus according to the present invention. 115 is a delay device for delaying a signal obtained by branching an output of an integer divider 86. The division ratio control device 85 operates using a delayed signal obtained by delaying the output signal of the integer divider 86 as a clock.

Figure 31:
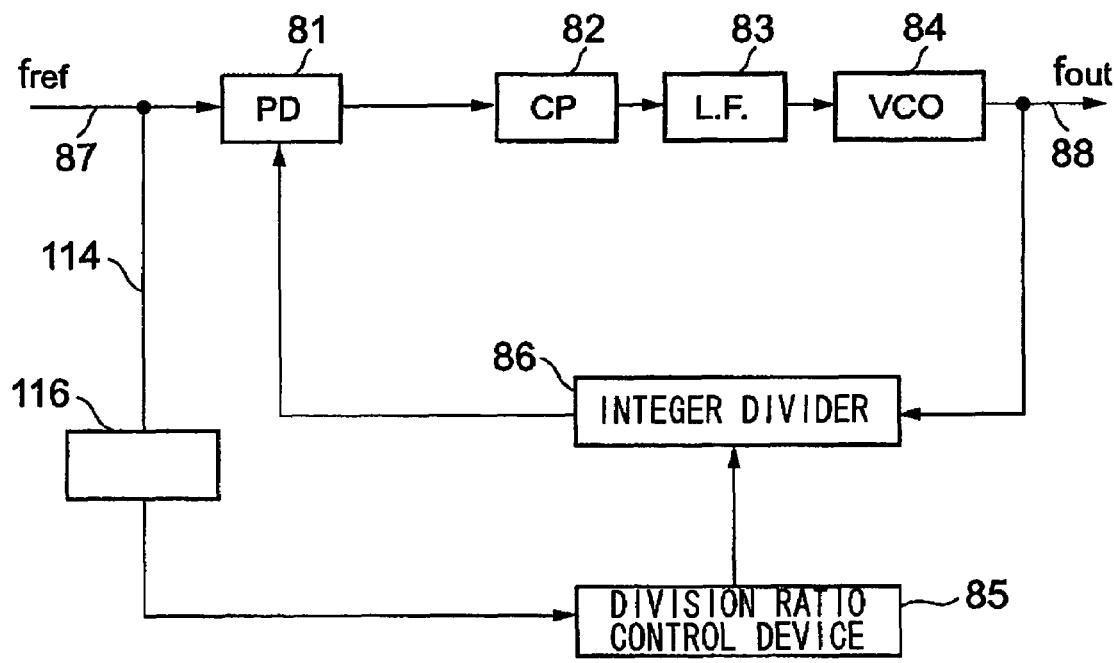
FIG. 31 is a block diagram showing a fifth embodiment of the fractional N-PLL synthesizer utilizing the signal processing apparatus according to the present invention.

FIG. 31 shows a block diagram concerning a fifth embodiment of the fractional N-PLL synthesizer utilizing the signal processing apparatus according to the present invention. 116 is a delay device for delaying a reference signal 114 branched from a reference signal 87. The division ratio control device 85 operates using a delayed signal obtained by delaying the reference signal 114 as a clock.

Figure 32:
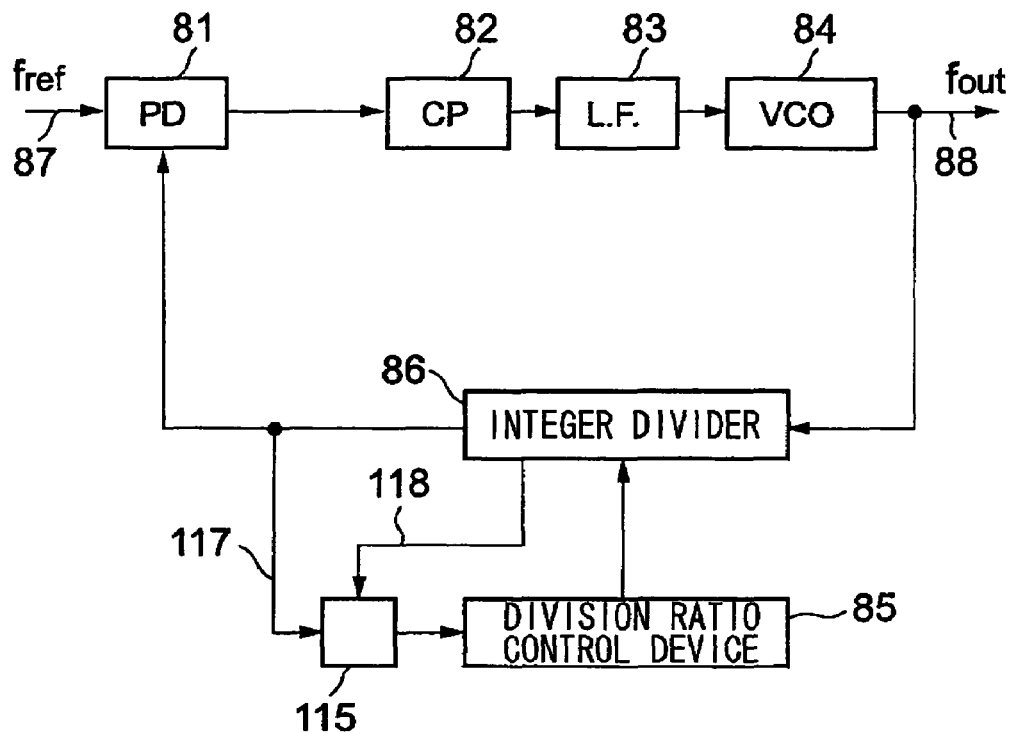
FIG. 32 is a block diagram showing a sixth embodiment of the fractional N-PLL synthesizer utilizing the signal processing apparatus according to the present invention.

FIG. 32 shows a block diagram concerning a sixth embodiment of the fractional N-PLL synthesizer utilizing the signal processing apparatus according to the present invention. 115 is a delay device for delaying a signal 117 obtained by branching an output of the integer divider 86. In order to keep the delay time of the delay device 115 constant, the delay device 115 receives a signal 118 from the integer divider 86. As examples of the signal 118, which is transferred from the integer divider 86 to the delay device 115, there are an output of a prescaler that comprises the integer divider 86 and an output of a swallower counter that also comprises the integer divider 86. The division ratio control device 85 operates using the signal 117 obtained by delaying the output signal of the integer divider 86.

Figure 33:
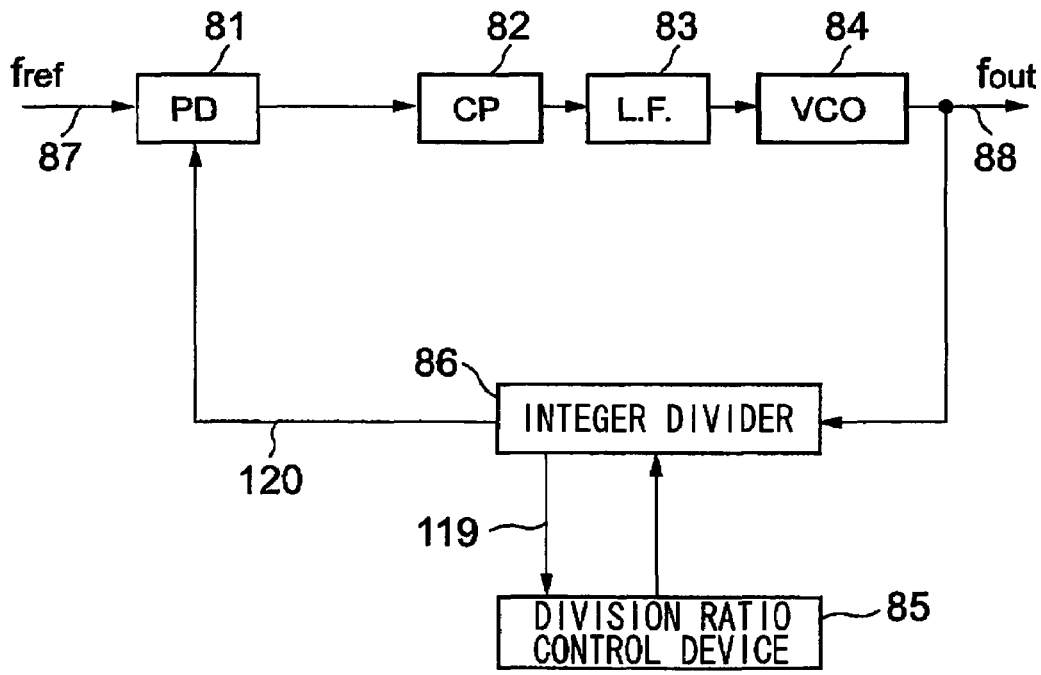
FIG. 33 is a block diagram showing a seventh embodiment of the fractional N-PLL synthesizer utilizing the signal processing apparatus according to the present invention.

FIG. 33 shows a block diagram concerning a seventh embodiment of the fractional N-PLL synthesizer utilizing the signal processing apparatus according to the present invention. An integer divider 86 is an integer divider that generates plural frequency-divided outputs of different phases. A signal 120, one of the outputs of the integer divider 86 is supplied to a PD 81, and the other output is supplied to the division ratio control device 85 as a clock signal 119.

POSSIBILITY OF INDUSTRIAL APPLICATION

As explained above, by utilizing the present invention, it is possible to provide a signal processing apparatus with a small circuit scale while maintaining the same input bit numbers, and solve problems of increase in chip area and consumption current. A fractional N-PLL synthesizer with a small circuit scale can be provided by having the signal processing apparatus according to the present invention, and especially by suppressing unwanted line spectrum, unwanted spuriousness can be suppressed.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. Signal processing apparatus comprising;
cascade-connected n-staged accumulators,
processing means for performing (m−1)th order differentiation of an overflow signal of an mth-stage accumulator (where $2 \leq m \leq n$), and
adding means for adding an output of the first-stage accumulator and all results of said differentiation of the second to nth-stage accumulators and outputting an added result, wherein
a signal input of p(1) bits is inputted into the first accumulator of p(1) bits,
q(m−1) bits from the most significant bit (termed "higher bits") (where $1 \leq q(m-1) \leq p(m)$) of an output of an (m−1)th-stage accumulator are inputted into higher bits of an mth-stage accumulator of p(m) bits (where $p(m) \leq p(m-1)$),
a logical operation result of at least a prescribed accumulator of (m+1)th-stage or later stage or stages, or an external {p(m)−q(m−1)} bit signal, which is a random signal, is inputted into the remaining less significant bits (termed "lower bits") of said mth-stage accumulator, and
p(1)>p(n) holds.

2. A signal processing apparatus as defined in claim 1 wherein all accumulators, and all means for performing differentiation and adding that comprise the signal processing apparatus operate in synchronization with a clock signal that is supplied externally.

3. A non-integer divider comprising an integer divider and one of the signal processing apparatuses as defined in claim 1, wherein the division ratio of said integer divider is controlled by an output value of said signal processing apparatus over time.

4. A non-integer divider as defined in claim 3 wherein an output signal of said integer divider is used as a clock of said signal processing apparatus.

5. A non-integer divider as defined in claim 3 comprising a clock generating device in synchronization with the operation of said integer divider as means for generating clock of said signal processing apparatus.

6. A non-integer divider as defined in claim 3 wherein a delayed output signal of said integer divider is used as means for generating clock of said signal processing apparatus.

7. A fractional N-PLL synthesizer comprising the non-integer divider as defined in claim 3.

8. A fractional N-PLL synthesizer as defined in claim 7 wherein a reference signal of said synthesizer is used as a clock of said signal processing apparatus.

9. A fractional N-PLL synthesizer as defined in claim 8 comprising a clock generating device in synchronization with a reference signal of said synthesizer as means for generating clock of said signal processing apparatus.

10. A fractional N-PLL synthesizer as defined in claim 8 wherein a delayed reference signal of said synthesizer is used as a clock of said signal processing apparatus.

11. Signal processing apparatus comprising;
a first p-bit signal input terminal and a second k-bit input signal terminal,
a first p-bit accumulator and a second q-bit accumulator, where q is an integer not larger than (p−1), and
adding means for adding an overflow signal of said first accumulator and a signal obtained by first order differentiation of an overflow signal of said second accumulator, wherein;
a p-bit signal inputted from said first signal input terminal is inputted into said first accumulator,
and (q−k) bits from the most significant bit (termed "higher bits") of the output signal of said first accumulator are inputted into higher (q−k) bits of the input of said second accumulator,
said second signal input terminal being connected to the remaining k bits of said second accumulator.

12. A signal processing apparatus as defined in claim 11 characterized by k=1.

13. Signal processing apparatus comprising;
a p(1)-bit first signal input terminal and a k-bit second signal input terminal with n accumulators (the first through nth), where n is an integer of at least 3,
processing means for performing (m−1)th order differentiation of an overflow signal of an mth accumulator for all the integers m (all the integers 1 to n inclusive), and
adding means for adding up the results of said differentiation of overflow signals of said first through nth accumulators, wherein;
provided that the number of bits of the mth accumulator is p(m), where p(2) is an integer not larger than (p(1)−1), higher (p(2)−k) bits of an output signal of the first accumulator are inputted into higher (p(2)−k) bits of the input of the second accumulator,
said second signal input terminal being connected to the remaining k bits of said second accumulator, and
provided that p(s) is an integer not larger than p(s−1) where the integers "s" represent all the integers of 3 through n inclusive, higher p(s) bits of an output signal of an (s−1)th accumulator are inputted into an sth accumulator.

14. A signal processing apparatus as defined in claim 13 wherein arbitrary k bits are selected from an output signal of at least an accumulator of the third stage or later stage or stages, and used as a signal inputted into said k-bit second signal input terminal.

15. A signal processing apparatus as defined in claim 13 wherein a signal inputted into said k-bit second signal input terminal is obtained by performing logic synthesis on an r-bit signal arbitrarily selected from the output of an accumulator of the third or later stage or stages.

16. A signal processing apparatus as defined in claim 13 comprising; a k(1)-bit third signal input terminal in addition to said p-bit first signal input terminal and said k-bit second signal input terminal, wherein;
for an integer t which is not smaller than 3 and not larger than n, higher (p(t)−k(1)) bits of an output signal of an adder of a (t−1)th accumulator are inputted into higher (p(t)−k(1)) bits of an input of a tth accumulator, and
said k(1)-bit third input terminal is connected to the remaining k(1) bits of said tth accumulator.

17. A signal processing apparatus as defined in claim 16 wherein arbitrary k(1) bits are selected from an output signal of at least an accumulator of a (t+1)th-stage or later stage or stages, and used as a signal inputted into said k(1)-bit third input terminal.

18. A signal processing apparatus as defined in claim 16 wherein a signal inputted into said k(1)-bit third input terminal is obtained by performing logic synthesis on an r-bit signal arbitrarily selected from an output of at least an accumulator of a (t+1)th-stage or later stage or stages.

19. A signal processing apparatus as defined in claim 16 characterized by k(1)=1.

20. A signal processing apparatus as defined in claim 16 without said k-bit second signal input terminal, wherein higher p(2) bits of an output signal of a first accumulator are inputted into higher p(2) bits of an input of a second accumulator.

21. A signal processing apparatus as defined in claim 13 comprising; a k(w)-bit input terminal for a random integer w, which is not less than 1 and not larger than v, where v integers are selected from (n−2) integer values included within a range of 3 to n, and their values are listed, t(1), t(2), . . . , t(v) in ascending order, wherein; higher p {t(w)}−k(w) } bits of an output signal of a {t(w)−1}th accumulator are inputted into higher p {t(w)−k(w)} bits of an input of a t(w)th accumulator, and the k(w)-bit input terminal is connected to the remaining k(w) bits of said t(w)th accumulator.

22. A signal processing apparatus as defined in either claim 21 wherein arbitrary k(w) bits are selected from an output signal of at least an accumulator of a (t(w)+1)th-stage or later stage or stages for integers w (some or all of the integers from 1 to v inclusive), and used as a signal inputted into said k(w)-bit input terminal.

23. A signal processing apparatus as defined in either claim 21, wherein a signal inputted into said k(w)-bit input terminal is obtained by performing logic synthesis on an r(w)-bit signal arbitrarily selected from an output of at least an accumulator of (t(w)+1)th-stage or later stage or stages for integers w (some or all of the integers from 1 to v inclusive).

24. A signal processing apparatus as defined in claim 21 characterized by k(w)=1 for all the integers w from 1 to v inclusive.

25. A signal processing apparatus comprising;
a first p-bit signal input terminal and a second k-bit signal input terminal with a first p-bit accumulator and a second q-bit accumulator, where q is an integer not larger than (p−1), and
adding means for adding a one-clock delayed overflow signal of said first accumulator and a signal obtained by first order differentiation of an overflow signal of said second accumulator, wherein;
a p-bit signal inputted from said first signal input terminal is inputted into said first p-bit accumulator,
higher (q−k) bits of the one-clock delayed output signal of said first accumulator are inputted into higher (q−k) bits of the input of said second accumulator, and
said second signal input terminal is connected to the remaining k bits of said second accumulator.

26. A signal processing apparatus as defined in claim 25 characterized by k=1.

27. A signal processing apparatus comprising;
a p(1)-bit first signal input terminal and a k-bit second signal input terminal with n accumulators (the first through nth), where n is an integer of at least 3,
processing means for performing (m−1)th order differentiation of an (n−m) clock delayed overflow signal of an mth accumulator for all the integers m (all the integers from 1 to n inclusive), and adding means for adding up the results of said differentiation of overflow signals of said first through nth accumulators, wherein;

the number of bits of the mth accumulator is p(m), where p(2) is an integer not larger than (p(1)−1), higher (p(2)−k) bits of a one-clock delayed output signal of the first accumulator are inputted into higher (p(2)−k) bits of the input of the second accumulator, said second signal input terminal being connected to the remaining k bits of said first accumulator, and, provided that p(s) is an integer not larger than p(s−1) where the integers "s" are all the integers of 3 through n inclusive, higher p(s) bits of a one-clock delayed output signal of an (s−1)th accumulator are inputted into an sth accumulator.

28. A signal processing apparatus as defined in claim 27 wherein arbitrary k bits are selected from an output signal of at least an accumulator of the third-stage or later stage or stages, and are used as a signal inputted into said k-bit second signal input terminal.

29. A signal processing apparatus as defined in claim 27 wherein a signal inputted into said k-bit second signal input terminal is obtained by performing logic synthesis on an r-bit signal arbitrarily selected from the output of an accumulator of the third-stage or later stage or stages.

30. A signal processing apparatus as defined in claim 27 comprising; a k(1)-bit third input terminal in addition to said p-bit first signal input terminal and said k-bit second signal input terminal, wherein; for an integer t which is not less than 3 and not larger than n, higher (p(t)−k(1)) bits of a one-clock delayed output signal of an adder of a (t−1)th accumulator are inputted into higher (p(t)−k(1)) bits of an input of a tth accumulator, and said k(1)-bit input terminal is connected to the remaining k(1) bits.

31. A signal processing apparatus as defined in claim 27 comprising; a k(w)-bit input terminal for a random integer w, which is not less than 1 and not larger than v, where v integers are selected from (n−2) integer values included within the range of 3 to n, and their values are listed, t(1), t(2), ..., t(v) in ascending order, wherein; higher p {t(w)−k(w)} bits of a one-clock delayed output signal of a {t(w)−1}th accumulator are inputted into higher p {t(w)−k(w)} bits of an input of a t(w)th accumulator, and the k(w)-bit input terminal being connected to the remaining k(w) bits of said t(w)th accumulator.

32. A signal processing apparatus comprising;
a p-bit first signal input terminal with a p-bit first accumulator and a q-bit second accumulator, where q is an integer not larger than (p−1), and
adding means for adding an overflow signal of said first accumulator and a signal obtained by first order differentiation of an overflow signal of said second accumulator, wherein;
a p-bit signal inputted from said first signal input terminal is inputted into said p-bit first accumulator, and higher q bits of the output signal of said first accumulator are inputted into higher q bits of the input of said second accumulator.

33. A signal processing apparatus comprising;
a p(1)-bit first signal input terminal with n accumulators (the first through nth), where n is an integer of at least 3,
processing means for performing (m−1)th order differentiation of an overflow signal of an mth accumulator for all the integers m (all the integers from 1 to n inclusive), and
adding means for adding up the results of said differentiation of overflow signals of the first through nth accumulators, wherein;
provided that the number of bits of the mth accumulator is p(m), where p(2) is an integer not larger than (p(1)−1), higher p(2) bits of an output signal of the first accumulator are inputted into higher p(2) bits of the input of the second accumulator;
and provided that p(s) is an integer not larger than p(s−1) where the integers "s" are all the integers of 3 through n inclusive, higher p(s) bits of an output signal of an (s−1)th accumulator are inputted into an sth accumulator.

* * * * *